US008961039B2

(12) United States Patent
Sano et al.

(10) Patent No.: US 8,961,039 B2
(45) Date of Patent: Feb. 24, 2015

(54) OPTICAL-ELECTRIC CONVERSION CONNECTOR

(75) Inventors: Yoshiaki Sano, Tokyo (JP); Takeshi Yamazaki, Tokyo (JP); Shuji Suzuki, Tokyo (JP)

(73) Assignee: Hirose Electric Co., Ltd., Tokyo (JP)

( * ) Notice: Subject to any disclaimer, the term of this patent is extended or adjusted under 35 U.S.C. 154(b) by 122 days.

(21) Appl. No.: 13/529,438

(22) Filed: Jun. 21, 2012

(65) Prior Publication Data
US 2013/0343711 A1 Dec. 26, 2013

(51) Int. Cl.
*G02B 6/36* (2006.01)

(52) U.S. Cl.
USPC .............................................. 385/89; 385/94

(58) Field of Classification Search
CPC .. G02B 6/4292; G02B 6/4204; G02B 6/4214; G02B 6/43; G02B 6/36
USPC ..................................... 385/88–94
See application file for complete search history.

(56) References Cited

U.S. PATENT DOCUMENTS

| 6,181,854 | B1 * | 1/2001 | Kojima et al. | 385/49 |
| 2001/0033722 | A1 * | 10/2001 | Okada et al. | 385/94 |
| 2006/0270283 | A1 * | 11/2006 | Kumazawa et al. | 439/676 |
| 2009/0245737 | A1 * | 10/2009 | Fujiwara et al. | 385/92 |

FOREIGN PATENT DOCUMENTS

| JP | 2007-264411 | 10/2007 |
| JP | 2008-256870 | 10/2008 |
| JP | 2010-135109 | 6/2010 |

* cited by examiner

*Primary Examiner* — Ryan Lepisto
*Assistant Examiner* — Erin Chiem
(74) *Attorney, Agent, or Firm* — Kubotera & Associates, LLC

(57) ABSTRACT

An optical-electric conversion connector configured to be connected to a mating connector. The optical-electric conversion connector includes an optical semiconductor element for converting between an optical signal and an electrical signal; a supporting member for supporting the optical semiconductor element; a contact member connected to the optical semiconductor element for contacting with a mating contact member of the mating connector; a first resin member formed of a transparent resin for integrally holding the optical semiconductor element, the supporting member, and the contact member, and a second resin member mounted on an outer surface of the first resin member. The first resin member is arranged to seal at least the optical semiconductor element. A method of producing the optical-electric conversion connector includes an element arrangement step, a conductive member connecting step, a first resin molding step, and a second resin molding step.

10 Claims, 13 Drawing Sheets

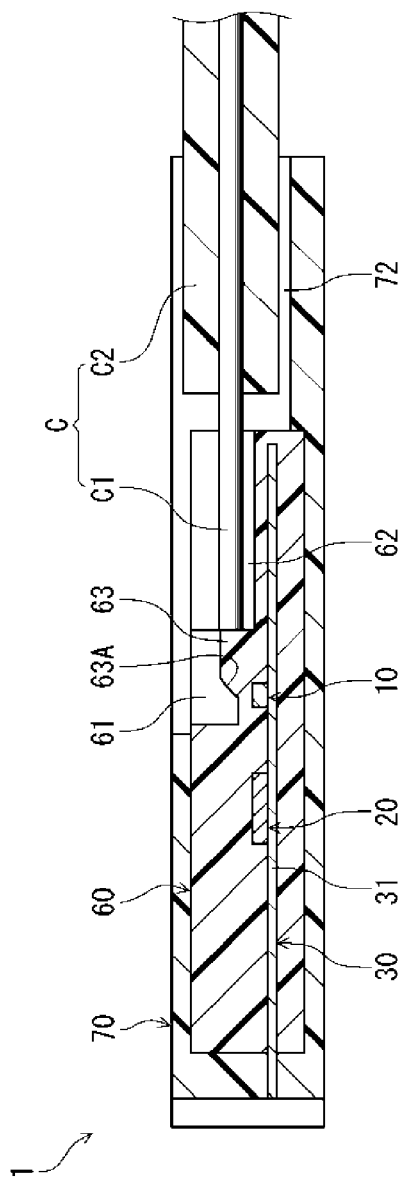
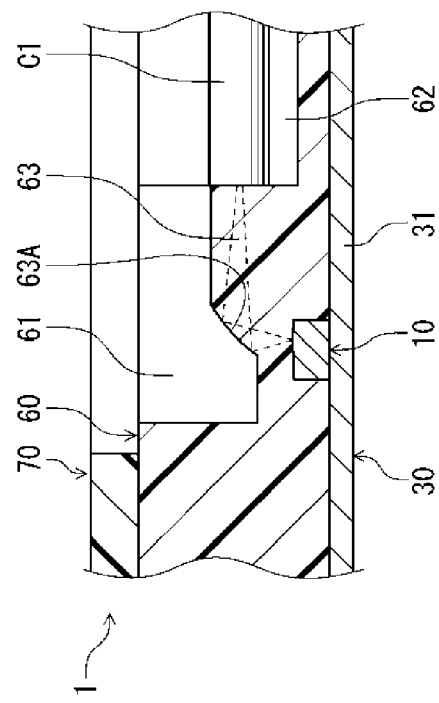

OPTICAL-ELECTRIC CONVERSION CONNECTOR

BACKGROUND OF THE INVENTION AND RELATED ART STATEMENT

The present invention relates to an optical-electric conversion connector and a method of producing the optical-electric conversion connector.

Patent References 1 to 3 have disclosed conventional optical-electric conversion connectors for converting an optical signal to an electrical signal and vise versa.

Patent Reference 1: Japanese Patent Publication No. 2010-135109

Patent Reference 2: Japanese Patent Publication No. 2007-264411

Patent Reference 3: Japanese Patent Publication No. 2008-256870

The conventional optical-electric conversion connector disclosed in Patent Reference 1 is configured to be connected to a mating connector mounted on a circuit board. Further, the conventional optical-electric conversion connector is connected to a distal end portion of an optical fiber cable extending in parallel to the circuit board.

In the conventional optical-electric conversion connector described in Patent Reference 1, a housing thereof is provided with a recessed portion opened upwardly toward the mating connector. An attachment member (a stage) is arranged in the recess portion and fixed to a bottom wall portion of the recess portion, so that an optical semiconductor element is attached to the attachment member at a specific position in a specific posture.

In the conventional optical-electric conversion connector described in Patent Reference 1, a light receiving surface of the optical semiconductor element is arranged to face backward in a direction perpendicular to the bottom wall portion. A ground plate is arranged on the bottom wall portion of the recess portion at a backside position relative to the attachment member. A guide groove is formed in a plate surface of the ground plate, so that the distal end portion of the optical fiber cable is supported in the guide groove.

In the conventional optical-electric conversion connector described in Patent Reference 1, after a height of the guide groove is adjusted, the optical semiconductor element is positioned relative to a bare wire of the optical fiber cable. In this state, a liquid resin is poured in the recess portion of the housing, so that the optical semiconductor element and the distal end portion of the optical fiber cable are fixed.

Patent Reference 2 has disclosed a conventional optical module. The conventional optical module includes a board, an optical semiconductor element mounted on the board in a posture with a light receiving surface thereof facing upwardly, and a receptacle mounted on the board for holding an optical fiber cable at a specific position. A distal end portion of the optical fiber cable is connected to the conventional optical module.

In the conventional optical module described in Patent Reference 2, the receptacle is formed of a transparent resin. The receptacle includes a retaining recess portion opened downwardly toward the board, a reflection surface for changing an optical path of an optical signal, an insertion hole for inserting the distal end portion of the optical fiber cable in parallel to the board, and a plurality of protruding portions extending downwardly for attaching the board.

In the conventional optical module described in Patent Reference 2, the protruding portions are inserted and engaged with attaching holes formed in the board, so that the receptacle is attached to the board. The optical semiconductor element mounted on the board is retained in the retaining recess portion of the receptacle. The distal end portion of the optical fiber cable is inserted and supported in the insertion hole. The reflection surface is situated above the optical semiconductor element at a front position relative to the distal end portion of the optical fiber cable, so that the reflection surface reflects the optical signal and bends the optical path for the right angle.

In the conventional optical module described in Patent Reference 2, a slight clearance is generated between the protruding portions of the receptacle and the attaching holes. When the conventional optical module is assembled, the receptacle is moved within the slight clearance while a light amount is measured with a light reception device and a light amount monitor arranged separately. Through the process, the receptacle is positioned relative to the optical semiconductor element.

Patent Reference 3 has disclosed a conventional optical fiber cable module. The conventional optical fiber cable module includes a board, a light receiving and emitting element mounted on the board, a film optical guide path, and a height adjustment member for adjusting a height of the film optical guide path such that a distal end portion of the film optical guide path is disposed on the height adjustment member.

In the conventional optical fiber cable module described in Patent Reference 3, the height adjustment member is formed in a frame shape. An inside portion of the height adjustment member forms a space penetrating in a vertical direction, so that the light receiving and emitting element is mounted on the board in the space. The light receiving and emitting element has a light receiving surface facing upwardly. The distal end portion of the film optical guide path is situated above the light receiving and emitting element.

In the conventional optical fiber cable module described in Patent Reference 3, the film optical guide path includes a front edge surface as an inclined surface inclined for 45 degrees, so that the inclined surface functions as a reflection surface for changing an optical path of an optical signal to the right angle. After the light receiving and emitting element is mounted on the board, a sealing resin is poured in the space of the height adjustment member, so that the light receiving and emitting element retained in the space is sealed.

In the conventional optical fiber cable module described in Patent Reference 3, when the conventional optical fiber cable module is assembled, the light receiving and emitting element is optically positioned relative to the film optical guide path using an image recognition apparatus provided separately.

As described above, in the conventional optical-electric conversion connector described in Patent Reference 1, it is necessary to provide the attachment member on the board, thereby increasing the number of the components. Further, the conventional optical-electric conversion connector is not provided with a mechanism for automatically positioning the optical semiconductor element. Accordingly, it is necessary to adjust the height of the guide groove to position the optical semiconductor element, thereby increasing the number of steps in a manufacturing process. When the number of the components and the number of the steps are increased, a manufacturing cost is inevitably increased.

Further, in the conventional optical-electric conversion connector described in Patent Reference 1, after the optical semiconductor element is optically positioned relative to the distal end portion of the optical fiber cable, the liquid resin is poured in the recess portion of the housing. Accordingly, the liquid resin may push the optical semiconductor element or the distal end portion of the optical fiber cable optically positioned already. As a result, the optical semiconductor element or the distal end portion of the optical fiber cable may be shifted from an adequate position.

As described above, in the conventional optical module described in Patent Reference 2, it is necessary to position the receptacle relative to the optical semiconductor element while the light amount is monitored with the light reception device and the light amount monitor arranged separately, thereby increasing the number of the steps in the manufacturing process and increasing the manufacturing cost.

In the conventional optical module described in Patent Reference 2, a resin may be poured in the retaining recess portion of the receptacle, so that the optical semiconductor element is sealed. In this case, the resin may leak from the retaining recess portion, and may be adhered to the reflection surface of the receptacle. Accordingly, it is difficult to seal the optical semiconductor element while avoiding the resin from leaking. In order to prevent the resin from leaking and adhering to the reflection surface, it is necessary to form the receptacle in a specific shape, or it is necessary to pour the resin with a special sealing device, thereby increasing the manufacturing cost.

As described above, in the conventional optical fiber cable module described in Patent Reference 3, it is necessary to position the light receiving and emitting element relative to the film optical guide path using the image recognition apparatus provided separately, thereby increasing the number of the steps and the manufacturing cost. Further, when the light receiving and emitting element is sealed with the sealing resin, the space of the height adjustment member remains opened upwardly. Accordingly, if the sealing resin leaks, the sealing resin may adhere to the reflection surface of the film optical guide path, making it difficult to seal the light receiving and emitting element without leaking the sealing resin.

In order to prevent the sealing resin from leaking and adhering to the reflection surface, in the conventional optical fiber cable module described in Patent Reference 3, it is necessary to form the height adjustment member in a specific shape, or it is necessary to pour the sealing resin with a special sealing device, thereby increasing the manufacturing cost.

In view of the problems described above, an object of the present invention is to provide an optical-electric conversion connector capable of solving the problems of the conventional optical-electric conversion connector. In the optical-electric conversion connector of the present invention, it is possible to automatically position an optical semiconductor element relative to an optical waveguide member without increasing the number of components or the number of steps in a manufacturing process. Accordingly, it is possible to seal the optical semiconductor element while the optical semiconductor element and the optical waveguide member are surely positioned.

Further objects and advantages of the invention will be apparent from the following description of the invention.

SUMMARY OF THE INVENTION

In order to attain the objects described above, according to a first aspect of the present invention, an optical-electric conversion connector is configured to be connected to a mating connector. The optical-electric conversion connector includes an optical semiconductor element for converting between an optical signal and an electrical signal; a supporting member for supporting the optical semiconductor element; a contact member connected to the optical semiconductor element for contacting with a mating contact member of the mating connector; a first resin member formed of a transparent resin for integrally holding the optical semiconductor element, the supporting member, and the contact member, said first resin member being arranged to seal at least the optical semiconductor element; and a second resin member mounted on an outer surface of the first resin member.

According to the first aspect of the present invention, the first resin member includes a waveguide supporting member for supporting an optical waveguide member and a reflection surface for reflecting the optical signal, so that the optical signal is transmitted between the optical waveguide member and the optical semiconductor element.

According to the first aspect of the present invention, when the optical-electric conversion connector is produced, the first resin member is molded integrally with the optical semiconductor element, the supporting member, and the contact member. Accordingly, the first resin member is arranged to seal at least the optical semiconductor element. At the same time, the first resin member is formed to have the waveguide supporting member and the reflection surface. Accordingly, when the first resin member is formed, the optical semiconductor element is positioned relative to the waveguide supporting member. As a result, when the optical waveguide member is disposed on the waveguide supporting member, it is possible to automatically and optically position the optical semiconductor element relative to the optical waveguide member.

According to a second aspect of the present invention, in the optical-electric conversion connector according to the first aspect, the supporting member and the contact member may be formed of one single metal lead frame. After the supporting member and the contact member are formed and integrated with the first resin member, the supporting member and the contact member are separated. The contact member may be formed as a terminal having in a plurality of narrow band pieces.

According to the second aspect of the present invention, when the supporting member and the contact member are formed of one single metal lead frame, it is possible to provide the terminal simply through separating the supporting member and the contact member after the first resin member is molded. Accordingly, after the first resin member is molded, it is not necessary to install the terminal as a separate component. As a result, it is possible to produce the optical-electric conversion connector through the simple step and install the terminal at an accurate position.

According to a third aspect of the present invention, in the optical-electric conversion connector according to the first aspect, the supporting member may be formed of a resin or a ceramic, and the contact member may be printed on the supporting member.

According to a fourth aspect of the present invention, in addition to the optical semiconductor element, the optical-electric conversion connector according to the first aspect may further include a drive device for driving the optical semiconductor element. The drive device is connected to the optical semiconductor element and the contact member, so that the optical semiconductor element is indirectly connected to the contact member through the drive device.

According to a fifth aspect of the present invention, a method of producing an optical-electric conversion connector to be connected to a mating connector includes an element arrangement step, a conductive member connecting step, a first resin molding step, and a second resin molding step.

According to the fifth aspect of the present invention, in the element arrangement step, first, an optical semiconductor element for converting between an optical signal and an electrical signal is positioned relative to a supporting member according to a reference hole formed in the supporting member or a member connected to the supporting member. Then, the optical semiconductor element is mounted on the supporting member.

According to the fifth aspect of the present invention, in the conductive member connecting step, a contact member for contacting with a mating contact member of the mating connector is connected to the optical semiconductor element with a conductive member.

According to the fifth aspect of the present invention, in the first resin molding step, first, the optical semiconductor element is sealed with a transparent resin according to the reference hole. Then, a waveguide supporting member for supporting an optical waveguide member and a reflection surface for reflecting the optical signal are molded using the transparent resin integrally with the optical semiconductor element, the supporting member, and the contact member in the state that the waveguide supporting member and the reflection surface are positioned relative to the supporting member according to the reference hole. Accordingly, the optical signal is transmitted between the optical waveguide member and the optical semiconductor element.

According to the fifth aspect of the present invention, in the second resin molding step, a resin different from the transparent resin is molded integrally on an outer surface of the transparent resin.

According to a sixth aspect of the present invention, in the method of producing the optical-electric conversion connector according to the fifth aspect, the supporting member and the contact member may be formed of one single portion of a metal lead frame having a carrier, and the reference hole may be formed in the carrier. Further, the contact member may be formed in a plurality of narrow band pieces.

According to the sixth aspect of the present invention, the method of producing the optical-electric conversion connector according to the fifth aspect may further include a cutting and separating step of cutting the contact member from the carrier of the metal lead frame at a portion of the contact member extending from the transparent resin after the first resin molding step, and a bending step of bending the contact member in a specific shape after the cutting and separating step.

According to the sixth aspect of the present invention, when the supporting member and the contact member are formed of one single metal lead frame, it is possible to provide the terminal simply through separating the supporting member and the contact member after the first resin molding step. Accordingly, after the first resin molding step, it is not necessary to install the terminal as a separate component. As a result, it is possible to produce the optical-electric conversion connector through the simple step and install the terminal at an accurate position.

According to a seventh aspect of the present invention, in the method of producing the optical-electric conversion connector according to the fifth aspect, the supporting member may be formed of a resin or a ceramic, and the contact member may be printed on the supporting member.

According to an eighth aspect of the present invention, the method of producing the optical-electric conversion connector according to the fifth aspect may further include a device mounting step of mounting a drive device for driving the optical semiconductor element on the supporting member or the member connected to the supporting member before the contact member connecting step. Accordingly, the drive device is connected to the optical semiconductor element and the contact member in the contact member connecting step, so that the optical semiconductor element is indirectly connected to the contact member through the drive device.

As described above, according to the present invention, when the first resin member (the transparent resin) is formed integrally with the optical semiconductor element, the waveguide supporting member and the reflection surface of the first resin member are formed at the same time. Accordingly, when the first resin member is formed, it is possible to optically position the waveguide supporting member relative to the optical semiconductor element.

Accordingly, it is possible to produce the optical-electric conversion connector through the integration molding process. As a result, simply through mounting the optical waveguide member on the waveguide supporting member, it is possible to automatically position the optical waveguide member relative to the optical semiconductor element optically.

Further, according to the fifth aspect of the present invention, the optical semiconductor element is positioned and the transparent resin is molded according to the same reference, i.e., the position of the reference hole. Accordingly, when the optical-electric conversion connector is produced through the integration molding process, it is possible to accurately position the waveguide supporting member relative to the optical semiconductor element at the same time.

Further, according to the present invention, when the optical semiconductor element is sealed, the waveguide supporting member formed of the transparent resin is positioned relative to the optical semiconductor element at the same time. Accordingly, it is possible to prevent the optical semiconductor element from shifting from the optical waveguide member that is positioned before the transparent resin is molded due to sealing the optical semiconductor element with the resin.

Further, according to the present invention, it is not necessary to provide a component or a device for positioning, and a step of performing only the positioning, thereby reducing the manufacturing cost.

BRIEF DESCRIPTION OF THE DRAWINGS

FIG. 3(A) is a sectional view showing the optical-electric conversion connector taken along a plane parallel with an extending direction of an optical waveguide member of the optical-electric conversion connector according to the first embodiment of the present invention;

FIG. 3(B) is a partially enlarged view showing a neighborhood of an optical semiconductor element of the optical-electric conversion connector according to the first embodiment of the present invention;

FIGS. 4(A) and 4(B) are sectional views showing the optical-electric conversion connector taken along planes perpendicular to the extending direction of the optical waveguide member according to the first embodiment of the present invention, wherein FIG. 4(A) is the sectional view taken along a plane where a signal terminal of the optical-electric conversion connector is situated, and FIG. 4(B) is the sectional view taken along a plane where a ground terminal of the optical-electric conversion connector is situated;

DETAILED DESCRIPTION OF THE PREFERRED EMBODIMENTS

Hereunder, embodiments of the present invention will be explained with reference to the accompanying drawings.

First Embodiment

Figure 1:
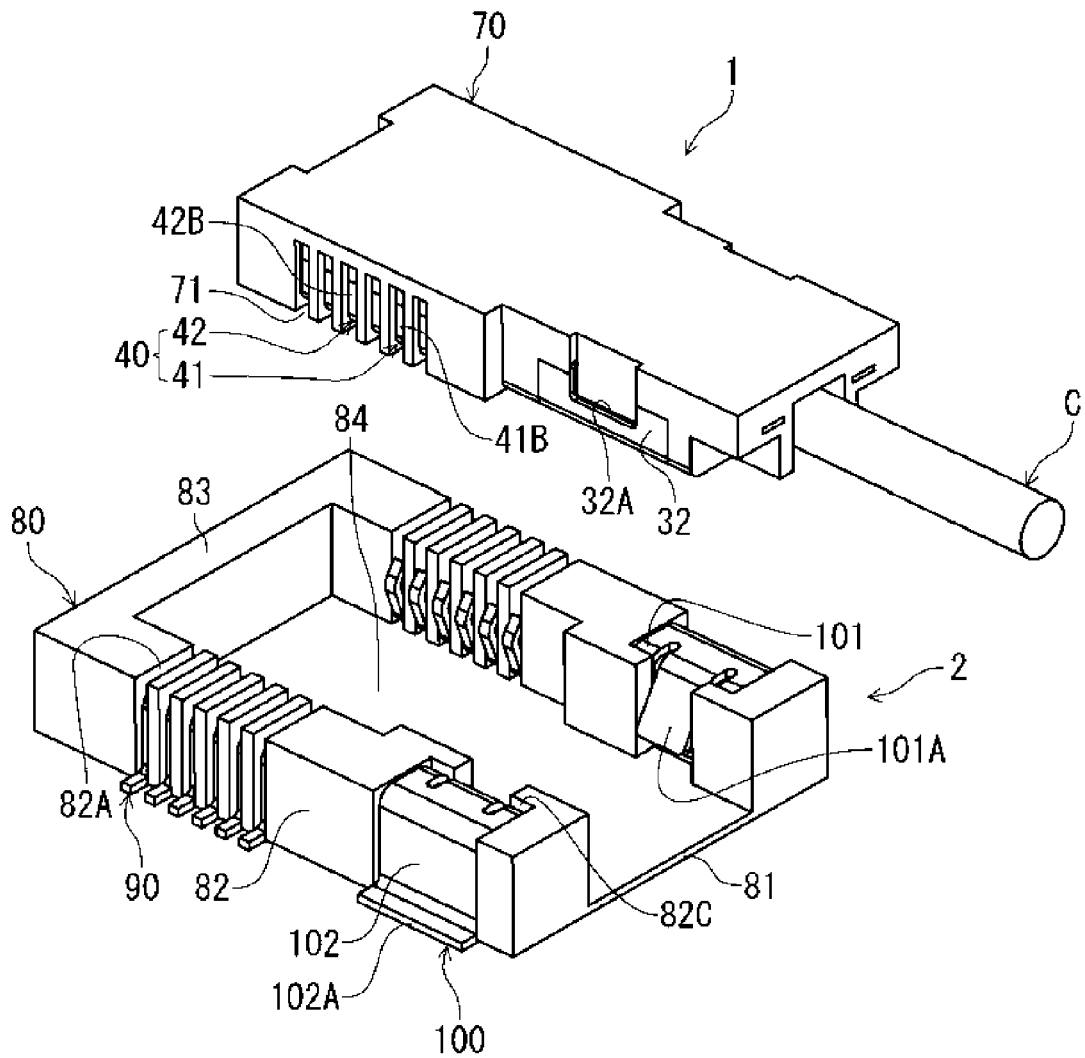
FIG. 1 is a perspective view showing an optical-electric conversion connector and a mating connector according to a first embodiment of the present invention.
Figure 2:
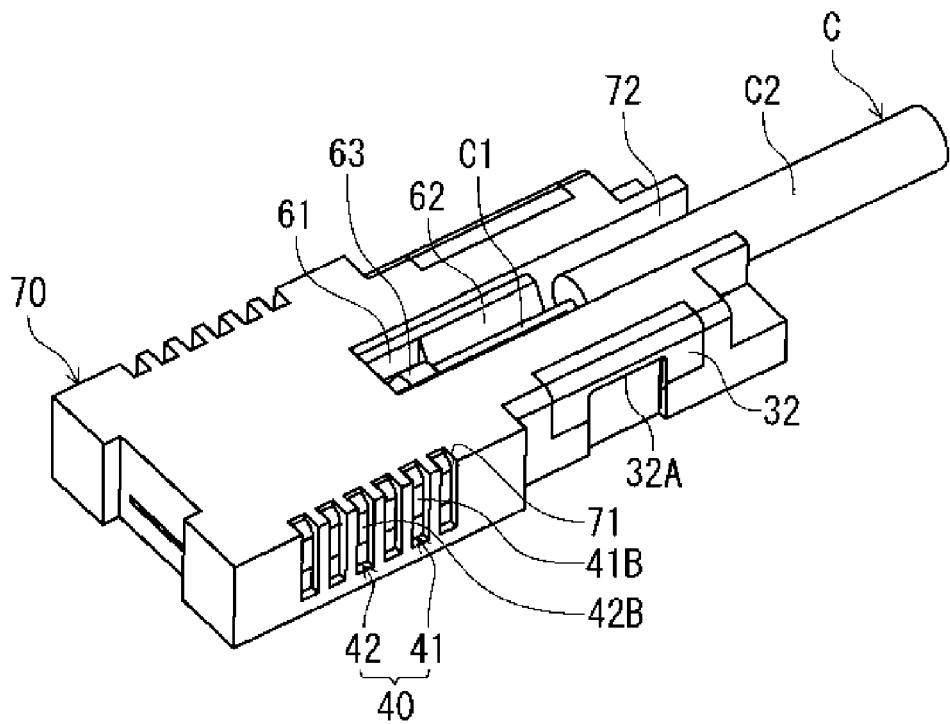
FIG. 2 is a perspective view showing the optical-electric conversion connector in a state that the optical-electric conversion connector is flipped vertically according to the first embodiment of the present invention.

FIG. 1 is a perspective view showing an optical-electric conversion connector (a connector) 1 and a mating connector 2 according a first embodiment of the present invention. In FIG. 1, the connector 1 and the mating connector 2 are in a state before being connected to each other. FIG. 2 is a perspective view showing the connector 1 in FIG. 1 in a state of being flipped vertically. FIG. 3 is a sectional view of the connector 1 in FIG. 1, taken along a plane parallel with an extending direction of an optical waveguide member (an optical fiber cable C).

Figure 4A:
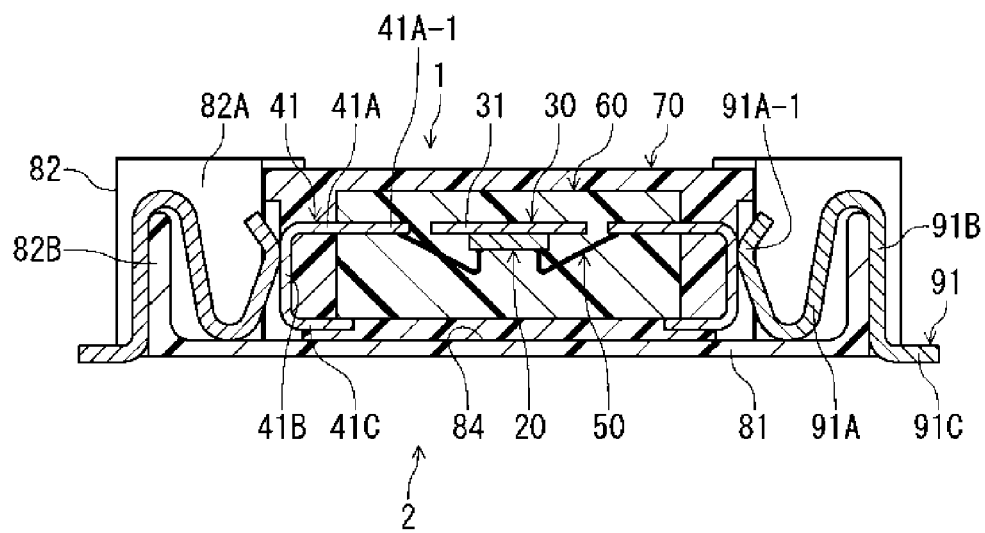
Figure 4B:
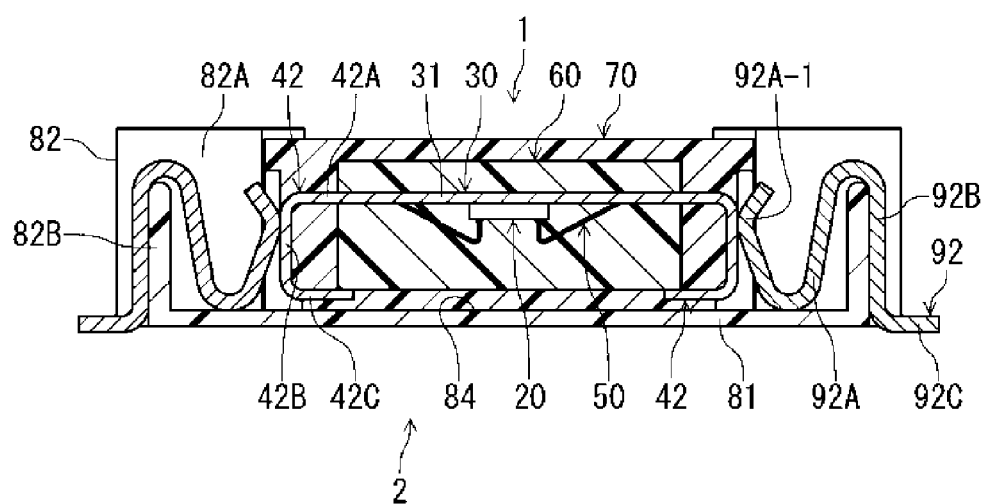

FIG. 3(B) is a partial enlarged view of FIG. 3(A), showing a neighborhood of an electrical semiconductor element (a photodetector 10). FIGS. 4(A) and 4(B) are sectional views taken along planes perpendicular to the extending direction of the optical waveguide member, respectively. FIG. 4(A) is a sectional view taken where a signal terminal 41 is situated. FIG. 4(B) is a sectional view taken where a ground terminal 42 is situated.

As shown in FIG. 1, the connector 1 according to the first embodiment of the present invention is connected to a distal end portion (left side portion in FIG. 1) of the optical fiber cable C as the optical waveguide member. The optical fiber cable C extends in a front-rear direction (a lateral direction in FIG. 1). Further, the connector 1 is connected to the mating connector 2 mounted on a circuit board (not shown).

In the embodiment, the connector 1 converts an optical signal to an electrical signal. Therefore, upon being connected to the mating connector 2, the connector 1 converts the optical signal received from the optical fiber cable C to the electrical signal and transmits the electrical signal thus converted to a circuit portion of the circuit board on which the mating connector 2 is mounted.

As shown in FIG. 3(A), the optical fiber cable C connected to the connector 1 is a well-known art, including a bare optical fiber (a bare wire) C1 composed of a core made of a glass covered with a clad made of a glass. The optical fiber cable C further includes a sheath C2 made from a resin and the like for covering the bare wire C1. In the embodiment, as shown in FIG. 3(A), the optical fiber cable C in not covered with the sheath C2 in the distal end portion thereof, therefore exposes the bare wire C1 thereof.

As shown in FIGS. 3(A) and 3(B), the connector 1 includes the photodetector 10 as an optical semiconductor element for converting the optical signal to the electrical signal, a drive device 20 for driving the photodetector 10, and a supporting member 30 for supporting the photodetector 10 and the drive device 20. As described later, the connector 1 further includes a plurality of terminals 40 as shown in FIGS. 1 and 2, for contacting a mating terminal 90 of the mating connector 2.

Furthermore, the connector 1 includes a wire 50 (refer to FIGS. 4(A) and 4(B)) as a conductive member for connecting the photodetector 10 to the drive device 20 as well as connecting the drive device 20 to the terminal 40, a first resin member 60 for holding the photodetector 10, the drive device 20, the supporting member 30, the terminal 40 and the wire 50 by being molded integrally, and a second resin member 70 integrally mounted on an outer surface of the first resin member 60. In the embodiment, a housing of the connector 1 is formed with the first resin member 60 and the second resin member 70.

Figure 6:
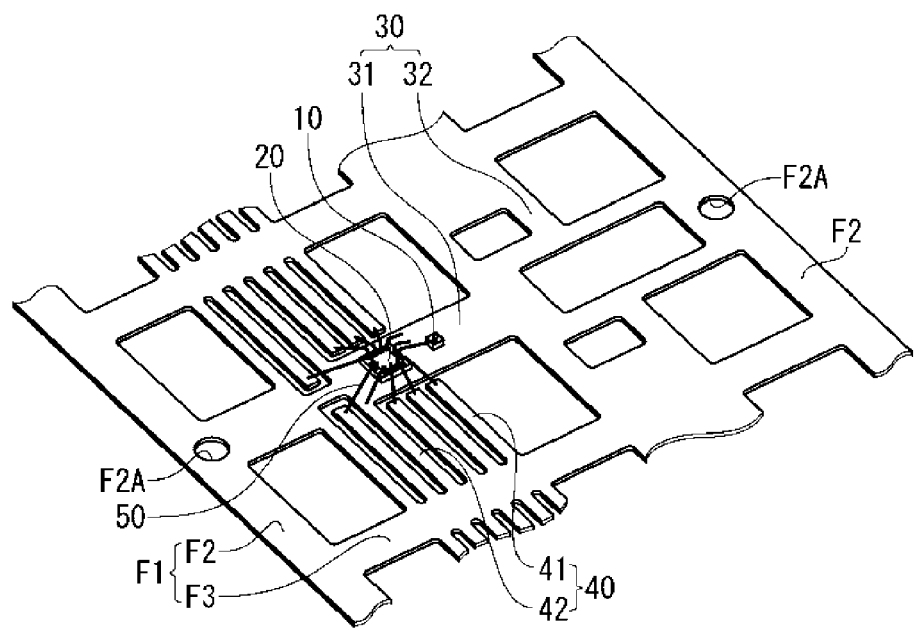
FIG. 6 is a perspective view showing the optical semiconductor element and a drive device mounted on the metal lead frame with the carrier according to the first embodiment of the present invention.

In the embodiment, the photodetector 10 has a light receiving surface for converting the optical signal to the electrical signal, for example, a photodiode (PD). As shown in FIGS. 3(A) and 3(B), the photodetector 10 is mounted on a supporting plate portion 31 (described later) of the supporting member 30 so that the light receiving surface thereof faces an upper direction. The drive device 20 (for example, a transimpedance amplifier/a limiting amplifier (TIA/LA)) drives the photodetector 10. The drive device 20 is mounted on the supporting plate portion 31 of the supporting member 30, so as to be situated in a front side of the photodetector 10. As shown in FIG. 6, the drive device 20 is connected to the photodetector 10 through the wire 50.

In the embodiment, as described above, the connector 1 is capable of converting the optical signal to the electrical signal and includes the photodetector 10 as the optical semiconductor element. The connector 1 may be capable of converting the electrical signal to the optical signal. When the connector 1 may be capable of converting the electrical signal to the optical signal, the connector 1 may include a light emitting element including a light emitting surface (for example, a vertical-cavity surface-emitting laser (VCSEL)) as the optical semiconductor element, instead of the photodetector 10. At this time, the drive device is provided for drive the light emitting semiconductor element (for example, a VCSEL driver).

In the embodiment, the supporting member 30 is made by punching out a metal plate. The supporting member 30 is provided so as to extend in the front-rear direction (a lateral direction in FIG. 3(A)). The supporting member 30 includes the supporting plate portion 31 in a front half portion or a portion shown in FIG. 3(A) thereof.

In the embodiment, the supporting plate portion 31 has a shape of a band with a plate surface perpendicular to a vertical direction. As described above, the photodetector 10 and the drive device 20 are mounted on the plate surface (an upper surface in FIG. 3(A)) of the supporting plate portion 31, thereby the supporting plate portion 31 supports the photodetector 10 and the drive device 20.

Figure 8:
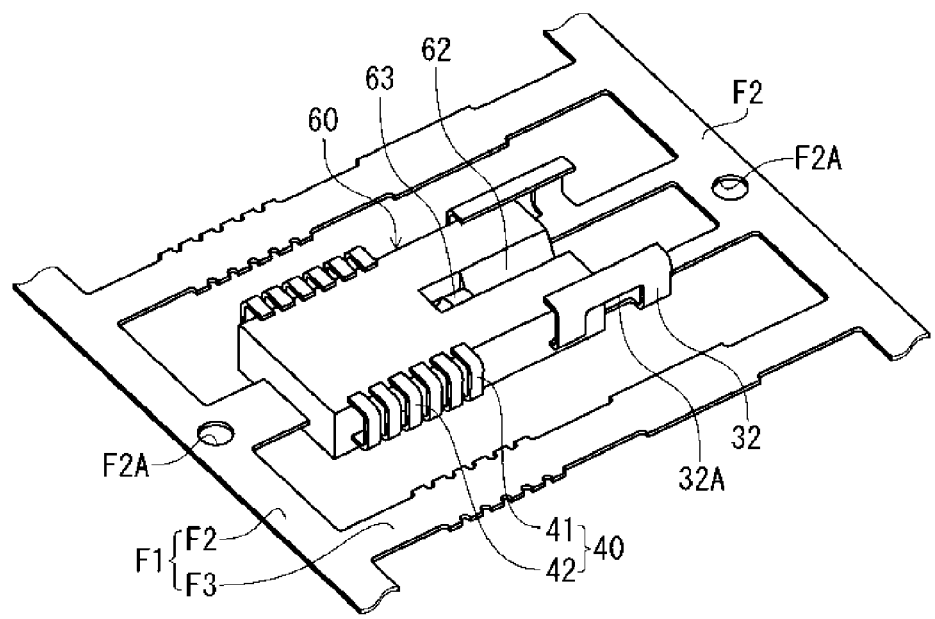
FIG. 8 is a perspective view showing the metal lead frame with the carrier in a state that the terminal and a locking portion of the metal lead frame are separated from the carrier and bent to have specific shapes according to the first embodiment of the present invention.

As shown in FIG. 8, a rear half portion of the supporting member 30 has a width wider than the supporting plate portion 31 in a width direction of the connector 1 and includes a locked portion 32 in both end portions in the width direction. The locked portion 32 is provided by bending the plate into a direction perpendicular to the width direction. The locked portion 32 has an opening penetrating therethrough in the width direction. As shown in FIG. 1, a lower edge of the opening (an upper edge in FIG. 2) functions as a locked edge portion 32A for engaging a locking piece 101A of the mating connector 2 as described later.

In the embodiment, the terminal 40 is provided by bending a metal strip in a thickness direction thereof. As shown in FIGS. 1 and 2, the terminal 40 is disposed in the front-rear direction forming two rows along both side surfaces of the connector 1. As described later, the supporting member 30 and the terminal 40 is manufactured as a single component in a metal lead frame F (refer to FIGS. 5 and 6) with a carrier F1 before the connector 1 is manufactured. The terminal 40 is separated from the carrier F1 after the first resin member 60 is molded. Further, the supporting member 30 is separated from the carrier F1 after the second resin member 70 is molded.

Figure 5:
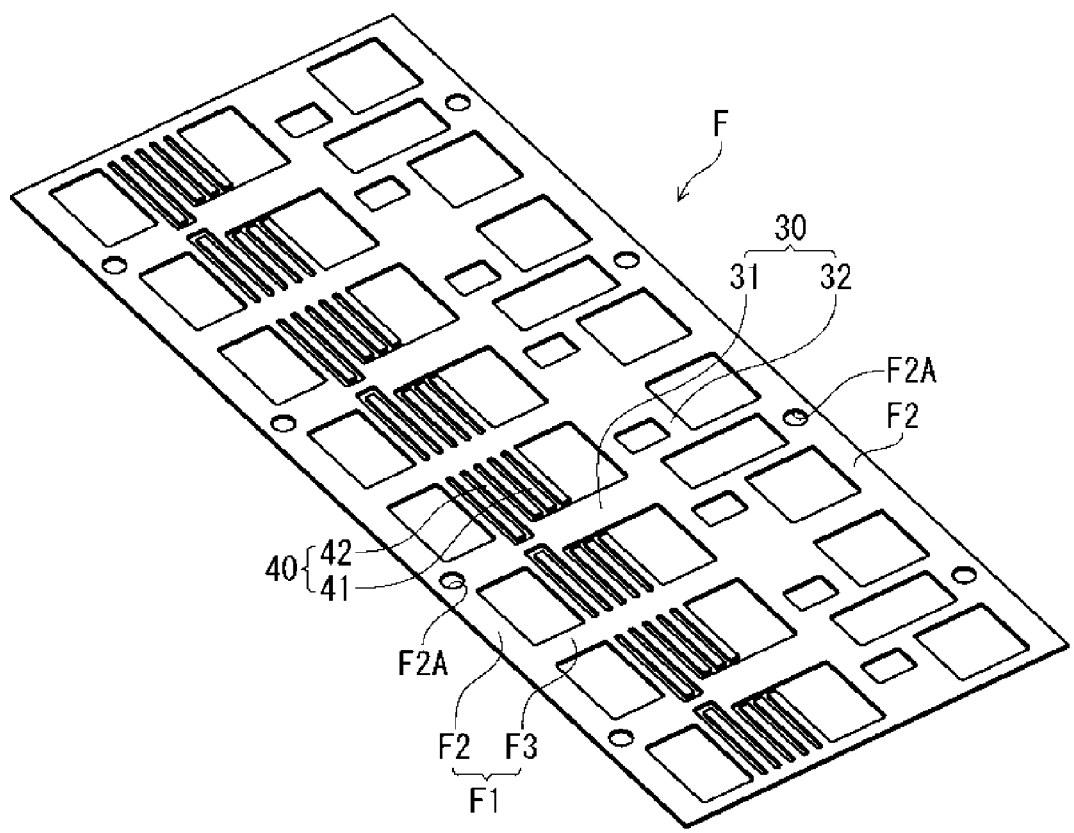
FIG. 5 is a perspective view showing a metal lead frame with a carrier according to the first embodiment of the present invention.

The plurality of the terminals 40 includes the signal terminal 41 and the ground terminal 42. As shown in FIGS. 4(A) and 4(B), because of being molded integrally, the signal terminal 41 and the ground terminal 42 are held doubly by the first resin member 60 and further the second resin member 70 covering the first resin member 60. Each of the terminal 40 is connected to the drive device 20 through the wire 50. As shown in FIG. 4(A), the signal terminal 41 is separated from the supporting member 30 while the ground terminal 42 is combined to the supporting member 30 as shown in FIGS. 4(B), 5 and 6.

As shown in FIG. 4(A), the signal terminal 41 has a substantial lateral U-letter shape and includes an upper arm portion 41A, a contact arm portion 41B and a lower arm portion 41C. The upper arm portion 41A extends in the width direction of the connector 1 (a lateral direction in FIG. 4(A)) being situated in the same position with the supporting member 30 in the vertical direction.

In the embodiment, the contact arm portion 41B extends in a lower direction by being bent from the upper arm portion 41A. The contact arm portion 41B contacts a corresponding contact portion 91A-1 of a mating signal terminal 91 of the mating connector 2 when the connector 1 is connected to the mating connector 2. The lower arm portion 41C extends along a lower surface of the connector 1 toward inside of the connector 1 in the width direction, being bent from the contact arm portion 41B.

In the embodiment, the upper arm portion 41A is held by the first resin member 60 and the second resin member 70. Further, the upper arm portion 41A includes a connecting portion 41A-1 at an inner end portion or an end portion closer to the supporting member 30 thereof. The connecting portion 41A-1 is connected to the drive device 20 through the wire 50. In addition, the contact arm portion 41B is held by the second resin member 70 with a plate surface thereof facing outside the connector 1 to be exposed for contacting the corresponding contact portion 91A-1 of the mating connector 2.

The ground terminal 42 has the same configuration with the signal terminal 41, except for being combined with the supporting member 30. Therefore, an explanation about the configuration of the ground terminal 42 will be omitted. As shown in FIG. 4(B), each component of the ground terminal 42 has a number adding one to a number of a corresponding component of the signal terminal 41.

The first resin member 60 is made of a transparent resin so that the optical signal from the optical fiber cable C is able to be transmitted through the first resin member 60. As shown in FIGS. 3(A), 3(B), 4(A) and 4(B), the first resin member 60 is molded integrally with the photodetector 10, the drive device 20, the wire 50 and the supporting member 30 and seals the photodetector 10 and the drive device 20.

The first resin member 60 has a substantial rectangular parallelepiped shape elongated in the front-rear direction. As shown in FIG. 3(A), the first resin member 60 includes a groove portion 61 on an upper surface in a rear half portion thereof. The groove portion 61 caves in at a central portion in the width direction of the connector 1 and extends in the front-rear direction.

As shown in FIG. 3(A), the groove portion 61 includes a bare wire holding portion 62 extending from a front side portion to a rear end thereof. The bare wire holding portion 62 has a V-letter sectional shape as taken in a direction perpendicular to the front-rear direction. The bare wire C1 exposed in the distal end portion of the optical fiber cable C is arranged on the bare wire holding portion 62. The bare wire holding portion 62 holds the bare wire C1 thus arranged.

As shown in FIGS. 3(A) and 3(B), the groove portion 61 further includes a rising portion 63 in a front side of the bare wire holding portion 62. The rising portion 63 rises in the upper direction than a lowest point of the bare wire holding portion 62. A rear end portion of the rising portion 63 has a surface perpendicular to the front-rear direction. A distal end surface of the bare wire C1 arranged on the bare wire holding portion 62 contacts the surface of the rear end portion of the rising portion 63.

Further, a front end surface of the rising portion 63 convexly curved in the front and upper directions. An inner surface of the front end surface functions as a reflection surface 63A. The reflection surface 63A reflects the optical signal from the optical fiber C in order to change an optical path of the optical signal.

As shown in FIGS. 3(A) and 3(B), the reflection surface 63A is situated above the photodetector 10. As shown in FIG. 3(B), the optical path shown with a dashed line moving forward inside the rising portion 63 from the distal end surface of the bare wire C1 of the optical fiber cable C changes the optical path thereof into the lower direction by being reflected on the reflection surface 63A. Thereby, the optical signal is collected on the light receiving surface of the photodetector 10.

As shown in FIGS. 1 and 2, the second resin member 70 is formed of an opaque resin and has a substantial rectangular parallelepiped shape. As shown in FIG. 3(A), the second resin member 70 extends backward relative to the first resin member 60. The second resin member 70 includes a terminal groove 71 on a side surface extending in the front-rear direction of a substantial front half portion thereof. The side surface also extends perpendicularly to the width direction of the connector 1.

In the embodiment, the terminal groove 71 is situated in a position corresponding to the terminal 40. Further, the terminal grove 71 has a recessed shape extending in the vertical direction. The terminal groove 71 retains the contact arm portions 41B and 42B of the signal terminal 41 and the ground terminal 42 therein, respectively. Each of plate surfaces of the contact arm portions 41B and 42B are exposed from the terminal groove 71. As shown in FIGS. 4(A) and 4(B), the terminal groove 71 allows the corresponding contact portions 91A-1 and 92A-1 of the mating connector 2 to enter when the connector 1 is connected to the mating connector 2.

As shown in FIGS. 1 and 2, a substantial rear half portion of the second resin member 70 has a width narrower than the width of the substantial front half portion of the second resin member 70. A side surface of the substantial rear half portion of the second resin member 70 is situated in the same position with an outer surface of the locked portion 32 (refer to FIG. 8 for the locked portion) of the supporting member 30 in the width direction of the connector 1.

Therefore, the side surface of the substantial rear half portion of the second resin member 70 is flush with the outer surface of the locked portion 32. The side surface includes a recessed portion in a position corresponding to the opening of the locked portion 32. The recessed portion is recessed by the same amount with a thickness of the plate of the locked portion 32. When the connector 1 is connected to the mating connector 2, the locked edge portion 32A engages the locking piece 101A of the mating connector 2 in the vertical direction or a connecting direction as the locking piece 101A enters in the recessed portion.

As shown in FIGS. 2 and 3(A), the second resin member 70 has a sheath holding portion 72 as a groove extending in the front-rear direction in an upper surface of the substantial rear half portion thereof. The sheath holding portion 72 is situated in a central position in the width direction, that is, a position corresponding to the bare wire holding portion 62 of the first resin member 60. The sheath holding portion 72 has a V-letter sectional shape as taken in a direction perpendicular to the front-rear direction.

As shown in FIGS. 2 and 3(A), the sheath holding portion 72 is situated on an extension line of the bare wire holding portion 62. Therefore, the sheath holding portion 72 forms one groove portion with the bare wire holding portion 62. The sheath holding portion 72 holds the distal end portion of the optical fiber cable C at a portion covered with the sheath C2 thereof.

In the embodiment, the groove formed with the bare wire holding portion 62 and the sheath holding portion 72 functions as a waveguide supporting member for supporting the distal end portion of the optical fiber cable C.

Hereunder, a manufacturing process of the connector 1 will be explained with reference to FIGS. 5 to 9. First, as shown in FIG. 5, the metal lead frame F with the carrier is provided by punching out a metal plate. The metal lead frame F is made to include the supporting member 30 and the terminal 40 so as to form one plate-shape member.

In the embodiment, the metal lead frame F accommodates a group of the connectors 1 composed of a plurality of connectors 1. The supporting member 30 and the terminal 40 corresponding to each of the connector 1 are connected to one carrier F1 as being arranged in an extending direction the terminal 40.

The carrier F1 includes two longitudinal carrier portions F2 and a plurality of lateral carrier portions F3. A front end portion and a rear end portion of the supporting member 30 are connected to the longitudinal carrier portion F2 extending in the extending direction of the terminal 40. The lateral carrier portion F3 extends in the front-rear direction or a direction perpendicular to the extending direction of the terminal 40 and combines two longitudinal carrier portions F2 at a position between the supporting members 30 situated next to each other.

As shown in FIG. 5, the terminal 40 and the locked portion 32 are connected to the lateral carrier portion F3 directly. Further, the ground terminal 42 of the terminal 40 is connected to the supporting plate portion 31 of the supporting member 30 directly as well. In contrast, the signal terminal 41 is connected indirectly to the supporting plate portion 31 through the carrier F1, instead of being connected directly to the supporting plate portion 31. In addition, the longitudinal carrier portion F2 includes a reference hole F2A in a position corresponding to the supporting portion 30 in an extending direction thereof.

Next, as shown in FIG. 6, the photodetector 10 and the drive device 20 are mounted on the supporting plate portion 31 of the supporting member 30 as being positioned according to the reference hole F2A. For example, the photodetector 10 and the drive device 20 are positioned by recognizing a position of the reference hole F2A using a image processing apparatus (not shown) according to images shot by a camera (not shown) set above the metal lead frame F.

Further, the photodetector 10 and the drive device 20 are connected to each other through the wire 50. The drive device 20 and the terminal 40 are connected to each other through the wire 50 as well. The wire 50 is connected by a method being well-known as a wire bonding.

Figure 7:
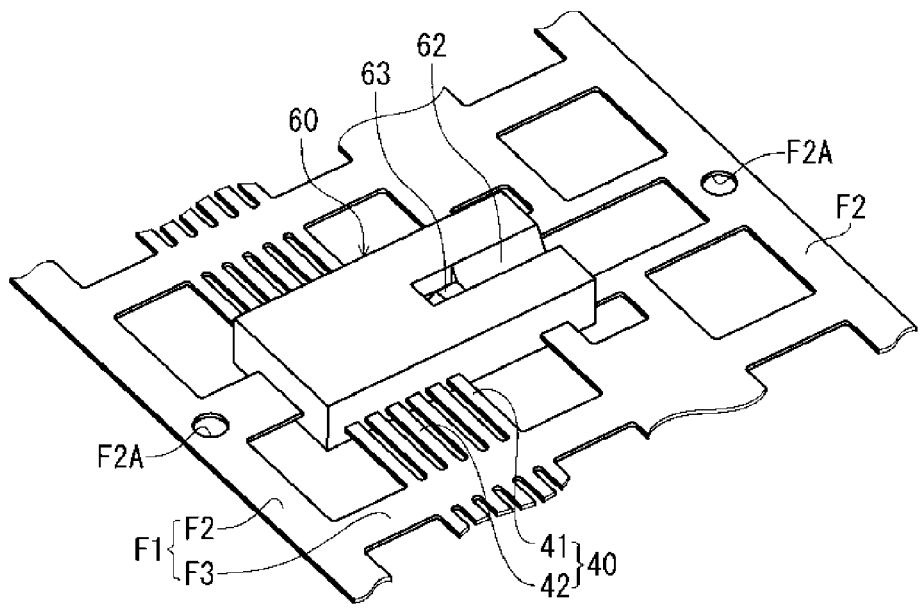
FIG. 7 is a perspective view showing the metal lead frame with the carrier in a state that a first resin member is integrally molded on the metal lead frame with the carrier according to the first embodiment of the present invention.

Next, as shown in FIG. 7, the photodetector 10, the drive device 20, the supporting member 30, the terminal 40 and the wire 50 are held integrally with a transparent resin, thereby molding the first resin member 60. The first resin member 60 is molded as being positioned relative to the supporting member 30, according to the reference hole F2A of the carrier F1.

More specifically, for example, a mold (not shown) for molding the first resin member 60 is positioned relative to the supporting member 30 by inserting a positioning pin thereof into the reference hole F2A. Then the transparent resin is poured into the mold. As a result of molding the first resin member 60, the photodetector 10, the drive device 20 and the wire 50 are sealed as well as the bare wire holding portion 62 and the reflection surface 63A of the first resin member 60 are formed.

It is preferable that the transparent resin used for the first resin member 60 has a high transmittance at a wavelength of the optical signal to be transmitted. In addition, it is preferable that the first resin member 60 is molded by a transfer molding.

It is possible to prevent damages such as breakage of the wire 50 and so on, as the first resin member 60 is molded by the transfer molding.

Next, as shown in FIG. 8, the terminal 40 and the locked portion 32 are separated from the lateral carrier portion F3 of the carrier F1 at portions thereof extending from the first resin member 60, respectively. Then, the terminal 40 and the locked portion 32 are formed by being bent at the portions thereof extending from the first resin member 60, respectively.

More specifically, the terminal 40 and the locked portion 32 are formed by being upwardly bent at positions adjacent to the first resin member 60 then inwardly bent in the width direction of the connector 1 at positions adjacent to distal end thereof, respectively.

Figure 9:
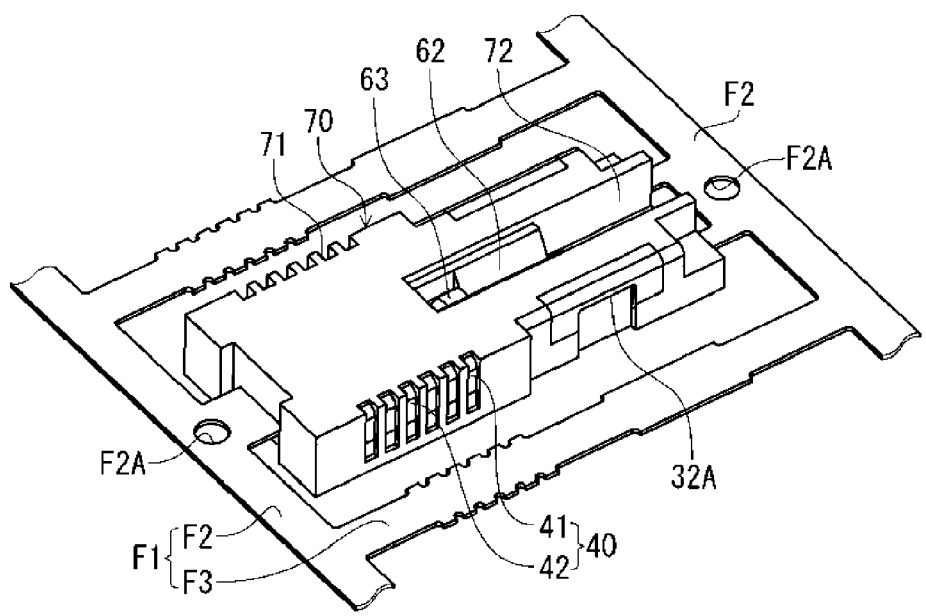
FIG. 9 is a perspective view showing the metal lead frame with the carrier in a state that a second resin member is integrally mounted on an outer surface of the first resin member according to the first embodiment of the present invention.

Next, as shown in FIG. 9, the second resin member 70 is integrally mounted on the outer surface of the first resin member 60. Similar to the first resin member 60, the second resin member 70 is mounted by poring a resin into a mold (not shown) for molding the second resin member 70, as the mold is positioned relative to the supporting member 30 according to the reference hole F2A of the carrier F1. By mounting the second resin member 70, the terminal groove 71 and the sheath holding portion 72 are formed as well as the first resin member 60 is covered with the second resin member 70. The second resin member 70 is easily molded by, for example, an injection molding.

After the second resin member 70 is mounted, the supporting member 30 is separated from the longitudinal carrier portion F2 of the carrier F1. Thereby, the connector 1 is manufactured completely. After the connector 1 is manufactured, the distal end portion of the optical fiber cable C is fixed with an adhesive and the like, as being arranged on the bare wire holding portion 62 and the sheath holding portion 72 of the connector 1, thereby connecting the connector 1 to the distal end portion of the optical fiber cable C.

In the embodiment, when the first resin member 60 is molded, the bare wire holding portion 62 and the reflection surface 63A are formed as well as the first resin member 60 and the photodetector 10 are integrally molded. In addition, the photodetector 10 and the mold for molding the first resin member 60 are positioned according to a position of the same reference hole F2A. Therefore, it enables to accurately position the photodetector 10, the bare wire holding portion 62 and the reflection surface 63A by molding the first resin member 60.

Further, when the second resin member 70 is mounted, the sheath holding portion 72 of the second resin member 70 is formed as the second resin member 70 is integrally molded on the outer surface of the first resin member 60. Furthermore, similar to the positioning of the photodetector 10 and the mold for the molding the first resin member 60, the mold for molding the second resin member 70 is positioned according to the position of the reference hole F2A.

Accordingly, it is possible to accurately position the sheathe holding portion 72 relative to the photodetector 10, the bare wire holding portion 62 and the reflection surface 63A by mounting the second resin member 70. Consequently, it is possible to automatically and optically position the optical fiber cable C and the photodetector 10 by simply arranging the optical fiber cable C to the waveguide supporting member composed of the bare wire holding portion 62 and the sheath holding portion 72.

Further, when the first resin member 60 is molded, the photodetector 10 and the bare wire holding portion 62 are positioned as the photodetector 10 is sealed. As compared to a conventional art, it is possible to prevent the photodetector and the optical fiber cable from shifting from positions determined before the resin is molded due to pouring the resin. Furthermore, in the embodiment, it is not necessary to provide a component or a device for positioning, and a step of performing only the positioning, thereby enabling to reduce a manufacturing cost.

In addition, in the embodiment, the supporting member 30 and the terminal 40 are formed as one single component with the metal lead frame F. Therefore, it enables to form the supporting member 30 and the terminal 40 by simply separating from the metal lead frame F after the first resin member 60 is formed. Therefore, it is not necessary to perform a manufacturing step of attaching the terminal provided as a separated component, following the molding of the first resin member 60. As a result, with the manufacturing process thus simplified, it enables to position the terminal 40 more accurately.

Next, configuration of the mating connector 2 will be explained. As shown in FIG. 1, the mating connector 2 includes a housing 80, a plurality of terminals 90 (mating terminals 90) and a locking member 100. The housing 80 is made of a synthetic resin having a substantial rectangular parallelepiped shape. The mating terminal 90 is made of a metal and disposed in the housing 80. The locking member 100 is held in the housing 80 and engages the locked portion 32 of the connector 1.

In the embodiment, the housing 80 includes a bottom wall 81, two sidewalls 82 and a front wall 83. The bottom wall 81 is arranged so as to face a circuit board (not shown). The sidewalls 82 stand from the bottom wall 81 extending in the front-rear direction and facing each other. The front wall 83 extends in the width direction or a direction the sidewalls 82 face each other and connects front end portions of the sidewalls 82. Further, a receptacle recess portion 84 for receiving the connector 1 from the upper direction is formed with the sidewalls 82 and the front wall 83. The receptacle recess portion 84 opens in the upper direction and a rear direction.

As shown in FIG. 1, a substantial front half portion of the sidewall 82 includes a terminal holding groove 82A for holding the mating terminal 90. The terminal holding groove 82A is provided as a recess in an inner surface, an upper surface and a lower surface of the sidewall 82 at a position corresponding to the mating terminal 90 (also refer to FIGS. 4(A) and 4(B)). In other words, as shown in FIGS. 4(A) and 4(B), the terminal holding groove 82A includes inner surfaces facing to each other in the front-rear direction (a direction perpendicular to a sheet surface). And the inner surfaces facing each other are connected through a connecting wall portion 82B.

In the embodiment, the connecting wall portion 82B extends in the vertical direction inside the terminal holding groove 82A. Further, as shown in FIG. 1, the sidewall 82 includes a locking member holding groove 82C in a position close to a rear end portion thereof. The locking member holding groove 82C is provided as a recess in the upper surface and the outer surface of the sidewall 82.

As shown in FIGS. 4(A) and 4(B), the mating terminal 90 is made by bending a metal strip in a thickness direction thereof. The mating terminal 90 has a substantial lateral S-letter shape. The plurality of the mating terminals 90 includes the mating signal terminal 91 (refer to FIG. 4(A)) and a mating ground terminal 92 (refer to FIG. 4(B)). The mating signal terminal 91 contacts the signal terminal 41 of the connector 1 and the mating ground terminal 92 contacts the ground terminal 42 of the connector 1, respectively.

The mating signal terminal 91 includes a substantial U-letter shape portion 91A, a held portion 91B and a connecting portion 91C. The substantial U-letter shape portion 91A is situated in a position closer to the receptacle recess portion 84 relative to the connecting wall portion 82B in the width direction of the connector (a lateral direction in FIGS. 4(A) and 4(B)).

In the embodiment, the held portion 91B is formed by bending one of two leg portions of the substantial U-letter shape portion 91A situated closer to the connecting wall portion 82B at an uppermost position so as to extend in the lower direction along an outer surface of the connecting wall portion 82B. The connecting portion 91C is formed by bending the held portion 91B at a lowermost position by the right angle so as to extend outside the terminal holding groove 82A.

The other of two leg portions of the substantial U-letter shape portion 91A situated closer to the receptacle recess portion 84 is bent a distal end portion thereof toward the receptacle recess portion 84 so as to be convexly curved toward the receptacle recess portion 84, thereby forming the corresponding contact portion 91A-1. The corresponding contact portion 91A-1 contacts the contact arm portion 41B of the signal terminal 41 of the connector 1.

As shown in FIGS. 4(A) and 4(B), the corresponding contact portion 91A-1 protrudes toward the receptacle recess 84. Therefore, when the connector 1 and the mating connector 2 are connected to each other, the substantial U-letter shape portion 91A deforms elastically as the contact arm portion 41B of the signal terminal 41 presses the corresponding contact portion 91A-1 thereof toward the connecting wall portion 82B in the width direction of the connector.

The held portion 91B is held in the terminal groove portion 82A as both side edge portions thereof extending in the vertical direction are pressed into the terminal groove portion 82A from the upper direction. Further, a lower surface of the connecting portion 91C is situated in a position slightly lower than a lower surface of the bottom wall 81 of the housing 80, thereby being soldered to a corresponding circuit portion of the circuit board.

The mating ground terminal 92 has the same configuration with the mating signal terminal 91. Therefore, an explanation about the configuration of the mating ground terminal 92 will be omitted. As shown in FIG. 4(B), each component of the mating ground terminal 92 has a number adding one to a number of a corresponding component of the mating signal terminal 91.

The locking member 100 is made by bending a metal plate in a thickness direction so as to have a shape of a substantial upside-down U-letter as being viewed from the front-rear direction. Therefore, the locking member 100 includes two plate portions facing each other in the width direction of the connector.

As shown in FIG. 1, one of the plate portions situated in an inner side of the sidewall 82 in the width direction forms an inner plate portion 101. The inner plate portion 101 includes the locking piece 101A at a lower end thereof. The locking piece 101A is formed by cutting and raising the lower end of the inner plate portion 101 toward the receptacle recess 84 for engaging the locked portion 32 in the connecting direction.

In addition, other of the plate portions situated in an outer side of the sidewall 82 in the width direction forms an outer plate portion 102. The outer plate portion 102 functions as a retained portion as both side edges thereof are pressed into the locking member holding groove 82C from the upper direction. Further, the outer plate portion 102 includes a fixing portion 102A extending outside the locking member holding groove 82C at a lower end portion thereof. The mating connector 2 is fixed to the circuit board as a lower surface of the fixing portion 102A is soldered to the circuit board. For being grounded, the corresponding circuit portion of the circuit board to which the fixing portion 102A is soldered may be a ground circuit (not shown).

Hereunder, a connecting operation of the connector 1 to the mating connector 2 will be explained. First, as shown in FIG. 1, the mating connector 2 is mounted on the circuit board (not shown) as the receptacle recess portion 84 thereof opens toward the upper direction, as well as the connector 1 connected to the distal end portion of the optical fiber cable C. Then the connector 1 is positioned above the mating connector 2 in a posture with the bare wire holding portion 62 and the sheath holding portion 72 thereof facing the lower direction.

Next, the connector 1 is moved in the lower direction to be inserted into the receptacle recess portion 84 of the mating connector 2. Accordingly, the signal terminal 41 and the ground terminal 42 of the connector 1 elastically contact the corresponding contact portion 91A-1 of the mating signal terminal 91 and the corresponding contact portion 92A-1 of the mating ground terminal 92 of the mating connector 2, respectively. Further, a lower end portion of the locking piece 101A of the mating connector 2 enters into the opening of the locked portion 32 of the connector 1. Therefore, the locking piece 101A engages the locked edge portion 32A, thereby enabling to prevent the connectors from inadvertently coming off from each other and the connecting operation of the connector 1 to the mating connector 2 is completed.

When the connector 1 and the mating connector 2 are connected to each other, the optical signal transmitted in the optical fiber cable C changes the optical path thereof into the lower direction by being reflected with the reflection surface 63A of the first resin member 60. As a result, the optical signal is collected on the light receiving surface of the photodetector 10. Then the photodetector 10 converts the optical signal to the electrical signal. The electrical signal thus converted is transmitted to the corresponding circuit portion of the circuit board to which the mating connector 2 is mounted, through the terminal 40 and the mating terminal 90.

In the embodiment, the first resin member includes the bare wire holding member and the second resin member includes the sheath holding member. Instead, for example, the first resin member may include both of the bare wire holding member and the sheath holding member.

Second Embodiment

In a second embodiment of the present invention, a supporting member is a board made of a resin and a contact member is a printed wiring on a surface of the board formed integrally with the board while the supporting member is made of the metal and the contact member is formed as the terminal separately formed from the supporting member in the first embodiment.

Figure 10:
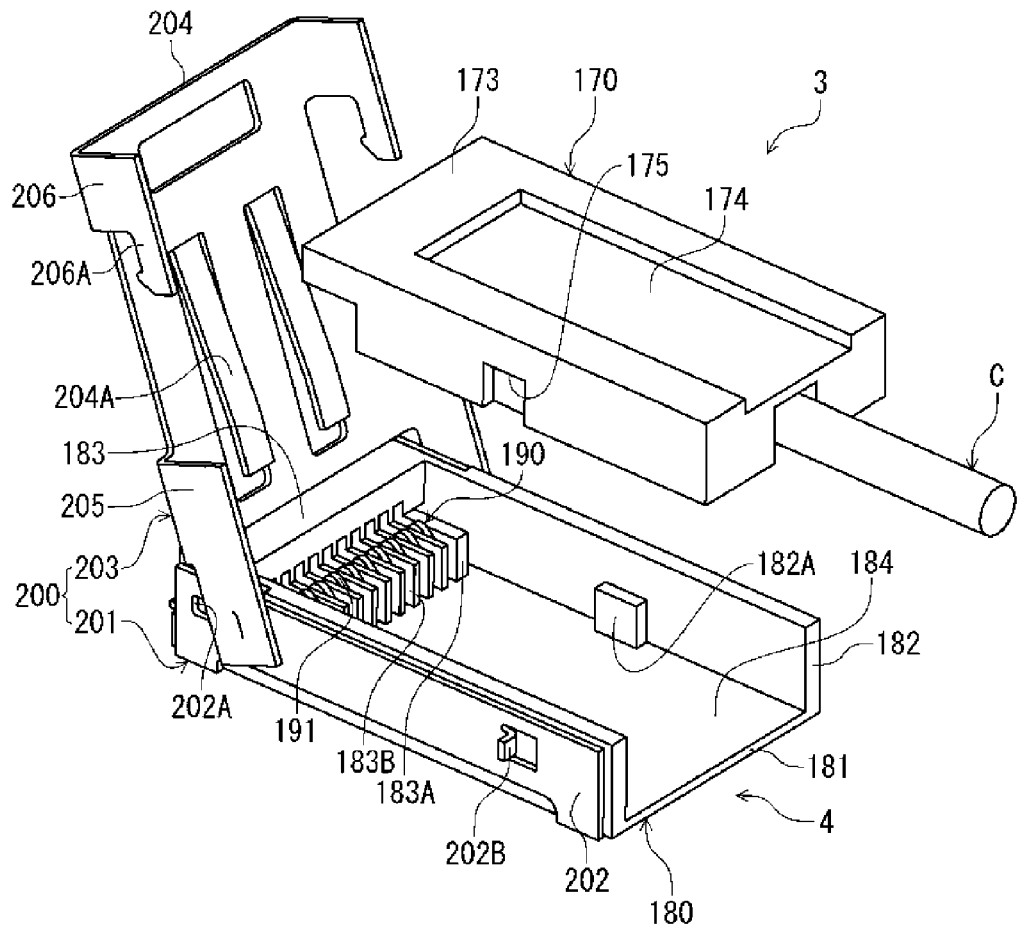
FIG. 10 is a perspective view showing an optical-electric conversion connector and a mating connector according to a second embodiment of the present invention.
Figure 11:
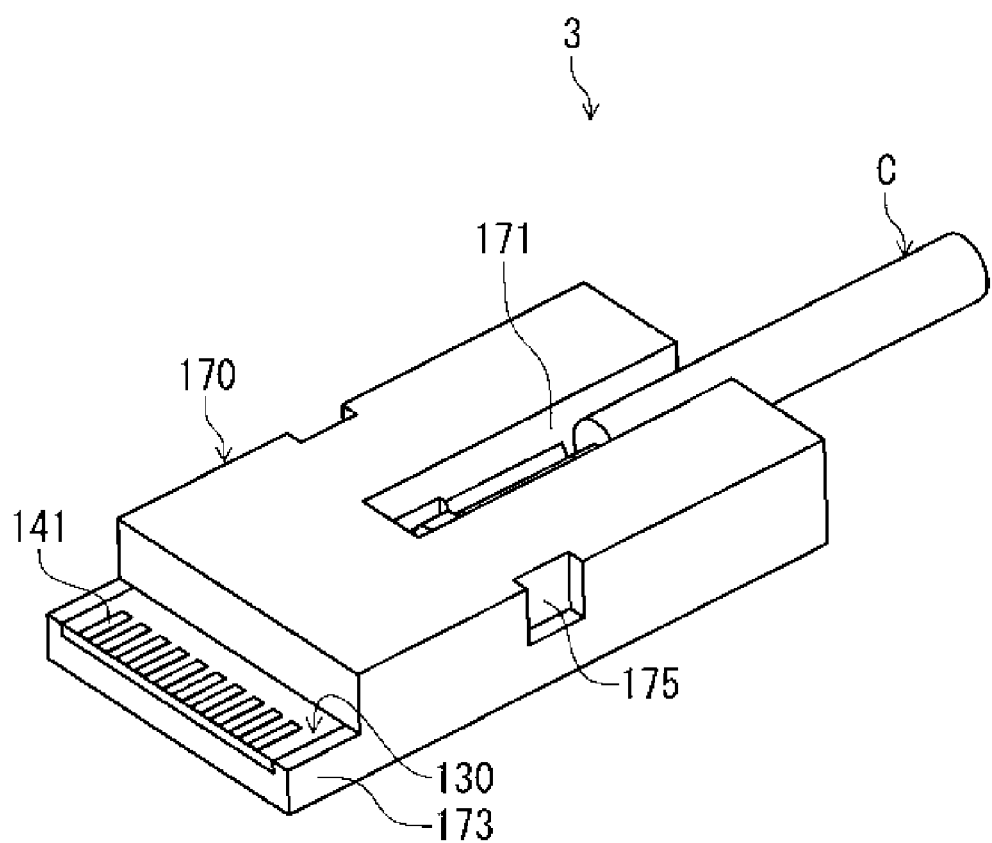
FIG. 11 is a perspective view showing the optical-electric conversion connector in a state that the optical-electric conversion connector is flipped vertically according to the second embodiment of the present invention.
Figure 12:
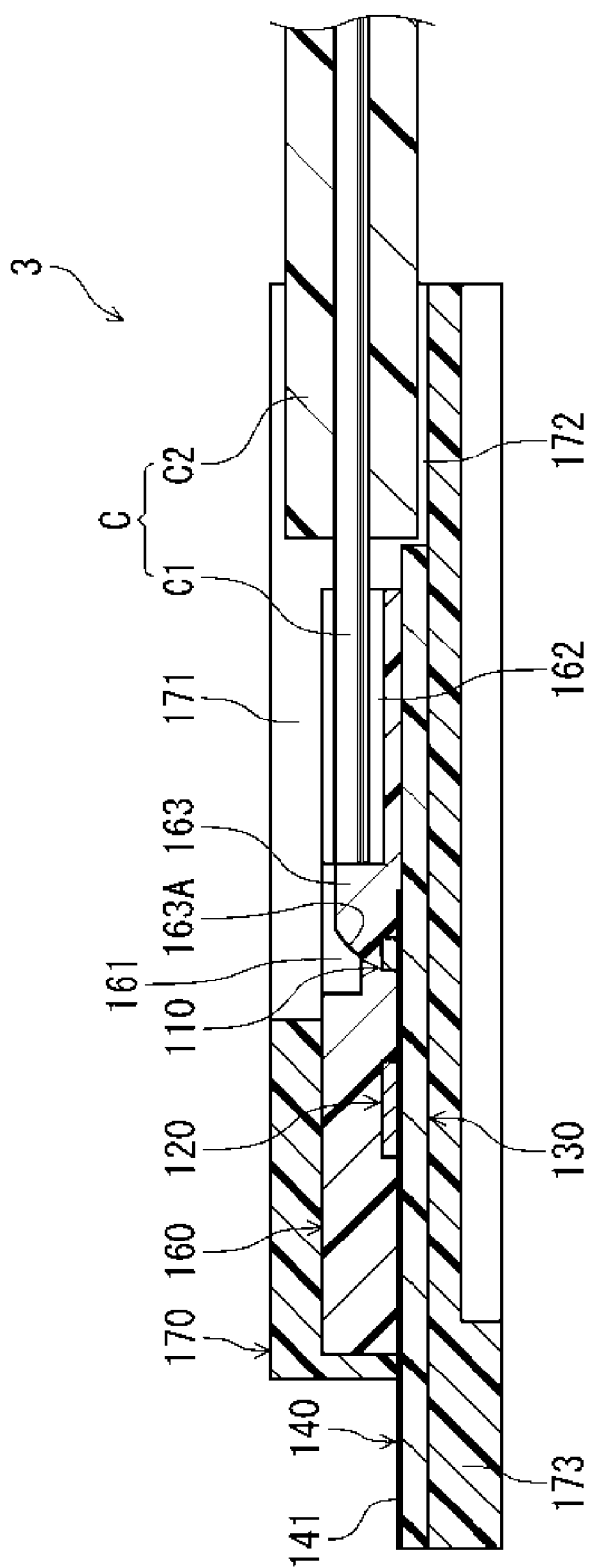
FIG. 12 is a sectional view showing the optical-electric conversion connector taken along a plane parallel with an extending direction of an optical waveguide member of the optical-electric conversion connector according to the second embodiment of the present invention.

FIG. 10 is a perspective view showing an optical-electric conversion connector 3 and a mating connector 4 according to the second embodiment of the present invention. In FIG. 10, the connector 3 and the mating connector 4 are in a state before being connected to each other. FIG. 11 is a perspective view showing the connector 3 in FIG. 10 being flipped vertically. FIG. 12 is a sectional view of the connector 3 taken along a plane parallel with an extending direction of an optical waveguide member (an optical fiber cable C).

As shown in FIGS. 10 and 11, similar to the connector 1 in the first embodiment, the optical-electric conversion connector 3 (the connector 3) is a connector to which a distal end portion of the optical fiber cable C as the optical waveguide member is attached. The optical fiber cable C extends in the front-rear direction (a lateral direction in FIGS. 10 and 11). The connector 3 is connected to the mating connector 4 mounted on a circuit board (not shown). In the embodiment, the optical fiber cable C has the same configuration with the optical fiber cable C in the first embodiment.

As shown in FIG. 12, the connector 3 includes a photodetector 110 as an optical semiconductor element, a drive device 120 for driving the photodetector 110, a board 130 as a supporting member for supporting the photodetector 110 and the drive device 120, a wiring 140 formed on a surface of the board 130 as a contacting member for contacting a mating terminal 190 of the mating connector 4 as described later, a wire 150 (refer to FIG. 14) as a conductive member for connecting the photodetector 110 to the drive device 120 as well as connecting the drive device 120 to the wiring 140, a first resin member 160 for supporting the photodetector 110, the drive device 120, the board 130, the wiring 140 and the wire 150 by being molded integrally, and a second resin member 170 integrally mounted on an outer surface of the first resin member 160. As described above, the board 130 functions as the supporting member in the embodiment.

In the embodiment, similar to the first embodiment, the first resin member 160 and the second resin member 170 form a housing of the connector 3. Further, in the embodiment, the photodetector 110 is used as the optical semiconductor element. As well as the first embodiment, the optical semiconductor element may be a light emitting element instead of the photodetector 110.

In the embodiment, the photodetector 110 and the drive device 120 have the same configurations and relative positionings with the photodetector 10 and the drive device 20 in the first embodiment, respectively. Therefore, explanations thereof will be omitted. As shown in FIG. 12, the board 130 is made of the resin (also refer to FIG. 13) and the wiring 140 is printed on an upper surface of the board 130. Accordingly, in the embodiment, the board 130 and the wiring 140 are integrally formed as a single component. Therefore, the board 130 and the wiring 140 are not separated in a manufacturing process of the connector 3 in contrast with the first embodiment.

The wiring 140 extends in the front-rear direction and includes a contact point 141 for contacting the mating terminal 190 of the mating connector 4 on an upper surface of a distal end portion thereof. A plurality of the contact points 141 includes a signal contact point and a ground contact point.

As shown in FIG. 11, the plurality of the contact points 141 is arranged with regular intervals in a width direction of the connector 3. In the embodiment, the board 130 is not limited to be made of the resin. For example, the board 130 may be made of a ceramic.

Figure 14:
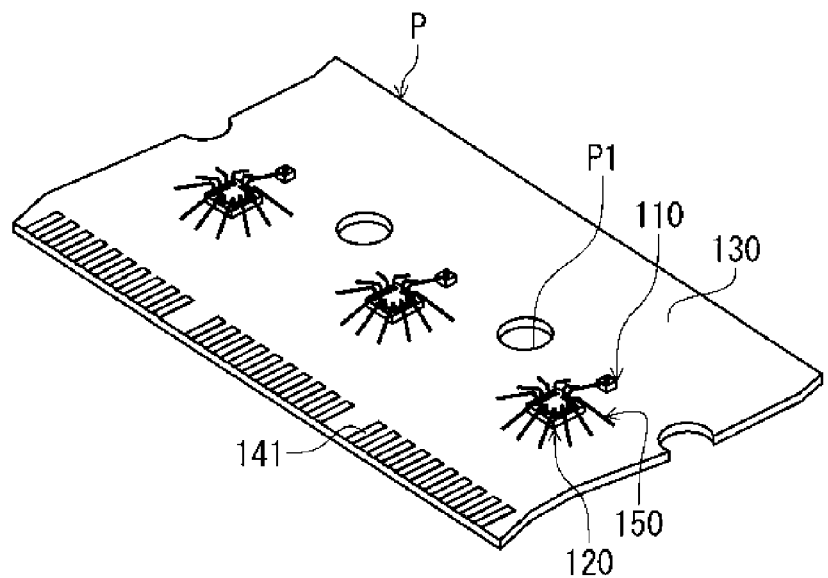
FIG. 14 is a perspective view showing an optical semiconductor element and a drive device mounted on the board of the optical-electric conversion connector according to the second embodiment of the present invention.

An explanation of the wire 150 will be omitted since the wire 150 is the same member with the wire 50 in the first embodiment (refer to FIG. 14). The first resin member 160 is made of a transparent resin and formed into a thin rectangular parallelepiped shape on the surface of the board 130 (refer to FIG. 15). Further, as shown in FIG. 12, a front end portion of the first resin member 160 is situated in a backside position relative to the contact point 141 of the wiring 140. Therefore, the contact point 141 is exposed.

Similar to the first embodiment, the first resin member 160 includes a groove portion 161, a bare wire holding portion 162, a rising portion 163 and a reflection surface 163A, having the same configuration with the groove portion 61, the bare wire holding portion 62, a rising portion 63 and the reflection surface 63A in the first embodiment, respectively. Therefore, an explanation thereof will be omitted.

As shown in FIGS. 11 and 12, the second resin member 170 is integrally mounted on the outer surface of the first resin member 160 forming a rectangular parallelepiped shape, remaining the contact point 141 of the wiring 140 exposed. Further, as shown in FIGS. 11 and 12, an upper half portion of a front end portion of the second resin member 170 is cut out throughout an entire range of the width of the connector 3. A lower half portion of the front end portion of the second resin member 170 provides a contact point disposing portion 173 for disposing the contact point 141 as being exposed on an upper surface thereof.

As shown in FIGS. 11 and 12, the second resin member 170 includes a groove portion 171 in an upper surface of a rear half portion thereof. The groove portion 171 caves in at a central portion in the width direction of the connector 3 and extends toward a rear side in the front-rear direction. A rear half portion of the first resin member 160 is situated in a front half portion of the groove portion 171. A rear half portion of the groove portion 171 has a V-letter sectional shape and provides a sheath holding portion 172.

As shown in FIG. 10, the second resin member 170 includes a pressed portion 174 on the upper surface (a lower surface in FIG. 12) of a substantial central portion in the width direction thereof, being recessed through a region from a portion adjacent to a front end to a rear end portion thereof. As described later, the pressed portion 174 is pressed from the upper direction with an elastic piece 204A provided on an upper plate portion 204 of a lid portion 203 of the mating connector 4 as shown in FIG. 10. The lid portion 203 is capable of rotating.

Furthermore, as shown in FIG. 10, the second resin member 170 includes a guided recess portion 175 on a side surface thereof. The guided recess portion 175 has a rectangular shape opened in the lower direction, formed by cutting out a substantial lower half portion (a substantial upper half portion in FIG. 12) in a middle portion of the side surface of the second resin member 170 in the front-rear direction. As described later, the guided recess portion 175 is guided by a guiding protrusion 182A of the mating connector 4 when the connector 3 is connected to the mating connector 4.

Figure 13:
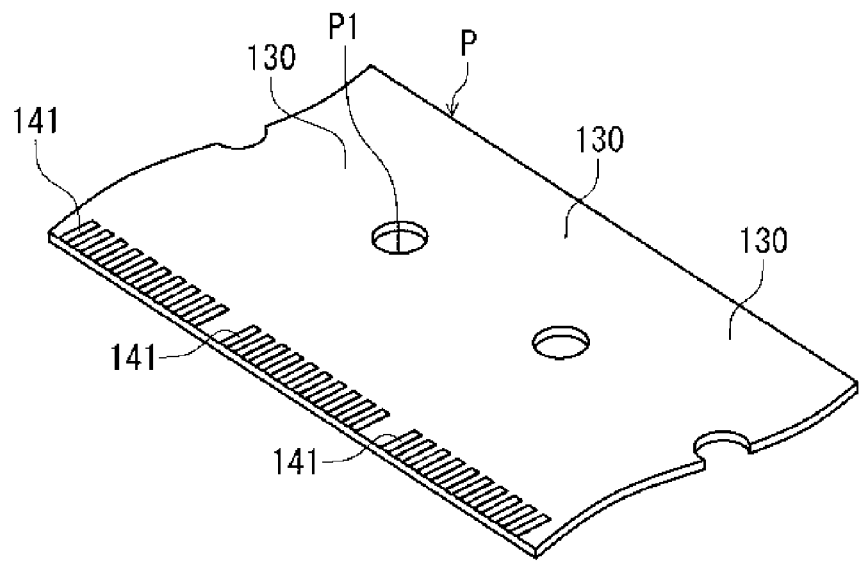
FIG. 13 is a perspective view showing a board of the optical-electric conversion connector according to the second embodiment of the present invention.

Hereunder, a manufacturing process of the connector 3 will be explained with reference to FIGS. 13 to 17. First, as shown in FIG. 13, a board material P including a plurality of the boards 130 corresponding to a plurality of the connectors 3 is provided as a single component.

In the embodiment, the board material P has a shape as the plurality of the boards 130 are combined in the width direction of the connector 3. In addition, the board material P includes a reference hole P1 for positioning situated in a position corresponding to where between the boards 130 arranged next to each other. Further, the wiring 140 (refer to FIG. 12) corresponding to each of the connectors 3 is printed on an upper surface of the board material P. In FIG. 13, only the contact point 141 of the wiring 140 is shown and the rest is omitted.

Next, as shown in FIG. 14, the photodetector 110 and the drive device 120 are mounted on the upper surface of the board 130 of the board material P as being positioned relative to the board 130 according to the reference hole P1 using the camera (not shown) and the image processing apparatus (not shown), similar to the first embodiment. Further, the photodetector 110 and the drive device 120 are connected to each other through the wire 150. The drive device 120 and the wiring 140 are connected to each other through the wire 150 as well. The wire 150 is connected by a method being well-known as a wire bonding.

Figure 15:
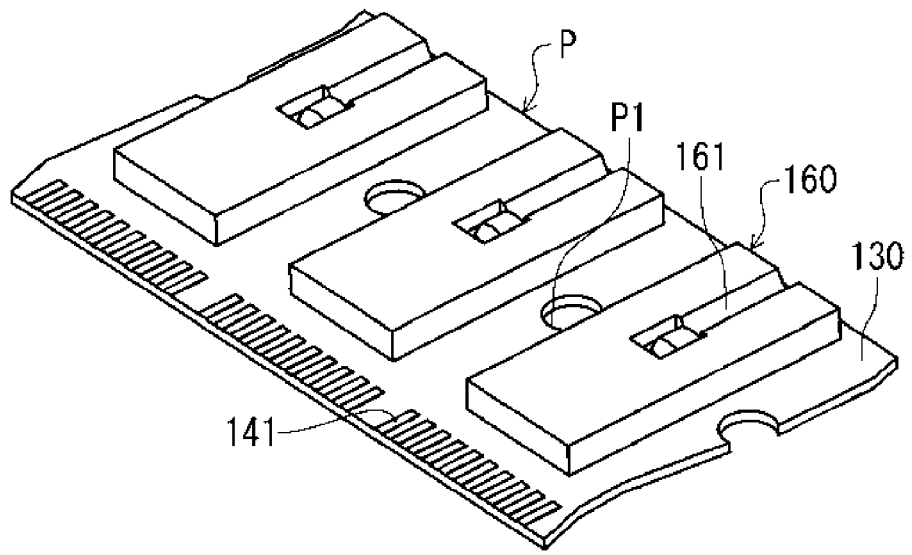
FIG. 15 is a perspective view showing the optical-electric conversion connector in a state that a first resin member is integrally molded on the board of the optical-electric conversion connector according to the second embodiment of the present invention.

Next, as shown in FIG. 15, the photodetector 110, the drive device 120, the board 130, the wiring 140 and the wire 150 are held integrally with a transparent resin, thereby molding the first resin member 160. The first resin member 160 is molded as being positioned relative to the board 130, according to the reference hole P1 of the board material P. For example, similar to the first embodiment, a mold (not shown) for molding the first resin member 160 is positioned by inserting a positioning pin thereof into the reference hole P1. As a result of molding the first resin member 160, similar to the first embodiment, the photodetector 110, the drive device 120 and the wire 150 are sealed as well as the bare wire holding portion 162 and the reflection surface 163A of the first resin member 160 are formed as being positioned.

Figure 16:
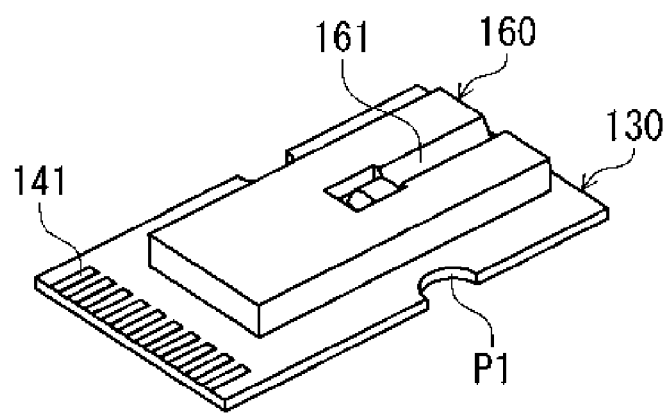
FIG. 16 is a perspective view showing the optical-electric conversion connector in a state that the board of the optical-electric conversion connector is separated according to the second embodiment of the present invention.
Figure 17:
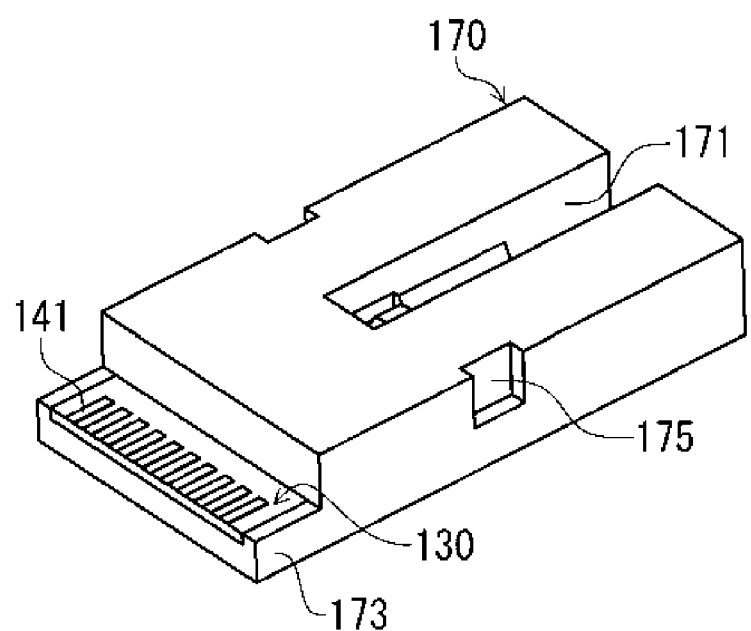
FIG. 17 is a perspective view showing the optical-electric conversion connector in a state that a second resin member is integrally mounted on an outer surface of the first resin member according to the second embodiment of the present invention.

Next, as shown in FIG. 16, the board material P is separated at a position of the reference hole P1 in the width direction. Accordingly, an intermediate corresponding to the connector 3 is provided in a state of the second resin member 170 is not yet mounted. Next, as shown in FIG. 17, the second resin member 170 is integrally mounted on the outer surface of the first resin member 160 as being positioned relative to the board 130 according to, for example, a front end of the board 130.

By mounting the second resin member 170, the groove portion 171, the sheath holding portion 172, the contact point disposing portion 173, the pressed portion 174 and the guided recess portion 175 of the second resin member 170 are formed as well as the first resin member 160 and the board 130 are covered with the second resin member 170. Thereby, the connector 3 is manufactured completely. Then, the distal end portion of the optical fiber cable C is fixed with an adhesive and the like, as being arranged on the bare wire holding portion 162 and the sheath holding portion 172 of the connector 3, thereby connecting the connector 3 to the distal end portion of the optical fiber cable C.

In the embodiment, when the first resin member 160 is molded, the bare wire holding portion 162 and the reflection surface 163A are formed as well as the first resin member 160 and the photodetector 110 are integrally molded, similar to the first embodiment. In addition, the photodetector 110 and the mold for molding the first resin member 160 are positioned according to a position of the same reference hole P1. Therefore, similar to the first embodiment, molding the first resin member 160 enables to accurately position the photodetector 110, the bare wire holding portion 162 and the reflection surface 163A in the embodiment. Therefore, it is possible to automatically and optically position the bare wire C1 of the optical fiber cable C and the photodetector 110 by simply arranging the optical fiber cable C to the bare wire holding portion 162.

Further, as well as the first embodiment, it is possible to prevent the photodetector and the optical fiber cable from shifting from positions positioned before the resin is molded due to pouring the resin. Furthermore, it is not necessary to provide a component or a device for positioning, and a step of performing only the positioning, thereby enabling to reduce a manufacturing cost.

As shown in FIG. 10, the mating connector 4 is mounted on a circuit board (not shown). The mating connector 4 includes a housing 180 for receiving the connector 3, a plurality of the mating terminals 190 disposed in the housing 180 and a shell member 200 made of a metal for covering the housing 180.

In the embodiment, the housing 180 has a substantial rectangular parallelepiped shape elongated in the front-rear direction. The housing 180 includes a bottom wall 181, two sidewalls 182 and a front wall 183. The bottom wall 181 is arranged to be parallel with the circuit board. The sidewalls 182 stand from the bottom wall 181 extending in the front-rear direction and facing each other.

In the embodiment, the front wall 183 extends in the width direction or a direction the sidewalls 182 face each other and connects front end portions of the sidewalls 182. Further, a receptacle recess portion 184 for receiving the connector 3 from the upper direction is formed with the sidewalls 182 and the front wall 183. The receptacle recess portion 184 opens in the upper direction and the rear direction.

The front wall 183 includes a protruding wall portion 183A. The protruding wall portion 183A protruding to the rear direction or toward the receptacle recess portion 184 is situated in a substantial lower-half portion of the front wall 183. Further, the front wall 183 includes a plurality of terminal holding grooves 183B in a substantial lower-half portion thereof.

In the embodiment, the terminal holding groove 183B has a slit shape penetrating the front wall 183 in the front-rear direction. The terminal holding groove 183B retains and holds the mating terminal 190 therein. Further, the terminal holding groove 183B has an opening opened in the upper and the rear directions where the protruding wall portion 183A exists. When the connector 3 and the mating connector 4 are connected to each other, the contact point disposing portion 173 of the connector 3 is accepted into the opening formed in an upper portion of the protruding wall portion 183A, that is, a part of the receptacle recess portion 184.

In a lower-half portion of an inner surface of the sidewall 182, the guiding protrusion 182A is provided. The guiding protrusion 182A is situated in a middle portion of the sidewall 182 in the front-rear direction and protrudes toward the receptacle recess portion 184. The guiding protrusion 182A has a rectangular shape corresponding to the guided recess portion 175 of the connector 3. Therefore, when the connector 3 is connected to the mating connector 4, the guiding protrusion 182A guides the connector 3 to a right position in the receptacle recess portion 184 as entering the guided recess portion 175.

The mating terminal 190 is made by bending a metal strip in a thickness direction thereof. The mating terminal 190 is held by pressing into the terminal holding groove 183B of the housing 180. One of end portions of the mating terminal 190 is held in the terminal holding groove 183B at a position the protruding wall portion 183A exists while other of the end portions of the mating terminal 190 extends in the front direction at a lower side of the front wall 183. The one of the end portions of the mating terminal 190 situated in the protruding wall portion 183A is convexly curved to provide a corresponding contact point portion 191 for contacting the contact point 141 of the connector 3. As shown in FIG. 10, an apex portion of the corresponding contact point portion 191 protrudes higher than the protruding wall portion 183A.

The shell member 200 is attached to the housing 180. The shell member 200 includes a box portion 201 for covering an outer side surface of the sidewall 182 and a front surface of the front wall 183 and the lid portion 203 attached to the box portion 201 for covering an upper surface of the connector 3 as the connector 3 is connected to the mating connector 4. The lid portion 203 is rotatable around the box portion 201.

Further, the box portion 201 includes a sidewall covering portion 202 for covering the outer side surface of the sidewall 182 of the housing 180 and a front wall covering portion (not shown) for connecting front end portions of the sidewall covering portions 202 and for covering the front surface of the front wall 183 of the housing 180.

The sidewall covering portion 202 includes a shaft supporting portion 202A as a hole penetrating in a thickness direction of the plate. The shaft supporting portion 202A is formed in a front portion of the sidewall covering portion 202. As described later, the shaft supporting portion 202A supports a shaft portion of the lid portion 203 so as to be rotatable. Further, the sidewall covering portion 202 includes an engaging portion 202B in a rear portion thereof. The engaging portion 202B is formed by cutting the sidewall covering portion 202 partially and then bending outward in the width direction of the connector. A plate surface of the engaging portion 202B is bent so as to have the right angle against the front-rear direction. As described later, the engaging portion 202B engages an engaged portion 206A of the lid portion 203 at a lower edge thereof.

The lid portion 203 is rotatable between an open position in a posture extending in the vertical direction as shown in FIG. 10 and a closed position in a posture extending in the front-rear direction.

At the open position, the lid portion 203 enables the connector 3 to enter the receptacle recess portion 184 while the lid portion 203 covers the upper surface of the connector 3 in a closed position. The lid portion 203 includes an upper plate portion 204, a front sideplate portion 205, and a rear sideplate portion 206. The upper plate portion 204 covers the upper surface of the connector 3 in the closed position. The front sideplate portion 205 is formed by bending a front portion (a lower portion in FIG. 10) of a side edge portion of the upper plate portion 204. The rear sideplate portion 206 is formed by bending a rear portion (an upper portion in FIG. 10) of the side edge portion of the upper plate portion 204.

The front sideplate portion 205 includes the shaft portion (not shown) formed by i.e., embossing. The shaft portion protrudes toward an inner side in the width direction of the connector. In the embodiment, the shaft portion is supported by the shaft supporting portion 202A of the box portion 201, thereby enabling the lid portion 203 to rotate between the open position and the closed position. In addition, the rear sideplate portion 206 includes the engaged portion 206A having a shape of an arm and the like and extending in the front direction (a rear direction in FIG. 10). The engaged portion 206A is engaged the engaging portion 202B of the box portion 201 at the closed position.

The upper plate portion 204 includes two elastic pieces 204A for pressing the pressed portion 174 of the connector 3 at the closed position. The elastic piece 204A extends in the front-rear direction (the vertical direction in FIG. 10). The elastic piece 204A is formed by partially cutting the upper plate portion 204 then bending so as to have a cantilever shape with a free edge in a front end thereof or a lower end thereof in FIG. 10. Further, as shown in FIG. 10, the elastic piece 204A is bent at a rear end thereof or an upper end thereof in FIG. 10 so as to be slightly inclined toward the rear direction in FIG. 10.

Hereunder, a connecting operation of the connector 3 to the mating connector 4 will be explained. First, as shown in FIG. 10, the mating connector 4 is mounted on the circuit board (not shown) as the receptacle recess portion 184 thereof opens toward the upper direction. Then the lid portion 203 of the shell member 200 is moved in the open position. Next, as shown in FIG. 10, the connector 3 connected to the distal end portion of the optical fiber cable C is positioned above the mating connector 4 in a posture with the groove portion 171 thereof facing the lower direction.

Next, the connector 3 is moved in the lower direction to be inserted into the receptacle recess portion 184 of the mating connector 4. When the connector 3 is placed into the receptacle recess portion 184, the connector 3 is led to a right position in the receptacle recess portion 184 as the guiding protrusion 182A of the mating connector 4 enters the guided recess portion 175 of the connector 3 from the lower direction. In addition, the contact point disposing portion 173 of the connector 3 is placed above the protruding wall portion 183A. Therefore, the contact point 141 disposed in the lower surface of the contact point disposing portion 173 contacts the corresponding contact point portion 191 of the mating connector 4.

After the connector 3 is placed in the receptacle recess portion 184 of the mating connector 4, the lid portion 203 of the shell member 200 is rotated to the closed position. At the closed position, the elastic piece 204A of the lid portion 203 presses the pressed portion 174 on the upper surface of the connector 3 in the lower direction. Accordingly, the contact point 141 of the connector 3 is pressed to the corresponding contact point portion 191 of the mating connector 4 from the upper direction, thereby contacting elastically.

In addition, at the closed position, the engaged portion 206A of the lid portion 203 is situated lower side of the engaging portion 202B of the box portion 201. Therefore, a lower edge of the engaging portion 202B engages an upper edge of the engaged portion 206A, thereby maintaining the lid portion 203 in the closed position. As a result, the contact point 141 and the corresponding contact point portion 191 maintain a state of contacting elastically, thus the connecting operation of the connector 3 to the mating connector 4 is completed.

When the connectors are connected to each other, the optical signal transmitted in the optical fiber cable C changes the optical path thereof into the lower direction by being reflected with the reflection surface 163A of the first resin member 160. As a result, the optical signal is collected on the light receiving surface of the photodetector 110. Then, the photodetector 110 converts the optical signal to the electrical signal. The electrical signal thus converted is transmitted to the corresponding circuit portion of the circuit board to which the mating connector 4 is mounted, through the wiring 140 and the mating terminal 190.

The disclosure of Japanese Patent Application No. 2011-039352 filed on Feb. 25, 2011, is incorporated in the application by reference.

While the invention has been explained with reference to the specific embodiments of the invention, the explanation is illustrative and the invention is limited only by the appended claims.

What is claimed is:

1. An optical-electric conversion connector to be connected to a mating connector, comprising:
an optical semiconductor element for converting between an optical signal and an electrical signal;
a supporting member for supporting the optical semiconductor element;
a contact member connected to the optical semiconductor element for contacting with a mating contact member of the mating connector;
a first resin member formed of a transparent resin for integrally holding the optical semiconductor element, the supporting member, and the contact member, said first resin member being arranged to seal at least the optical semiconductor element; and
a second resin member mounted on an outer surface of the first resin member,
wherein said first resin member includes a waveguide supporting member for supporting an optical waveguide member,
said first resin member further includes a rising portion, said rising portion includes a vertical surface arranged to face a distal end surface of the optical waveguide member so that the optical signal passes through the rising portion, and said rising portion further includes a reflection surface opposite to the vertical surface for reflecting the optical signal inside the rising portion so that the optical signal is transmitted directly from the optical waveguide member to the optical semiconductor element.

2. The optical-electric conversion connector according to claim 1, wherein said supporting member and said contact member are formed of one single metal lead frame integrated with the first resin member, said contact member being formed in a plurality of narrow band pieces.

3. The optical-electric conversion connector according to claim 1, wherein said supporting member is formed of a resin or a ceramic, said contact member being printed on the supporting member.

4. The optical-electric conversion connector according to claim 1, further comprising a drive device for driving the optical semiconductor element, said drive device being connected to the optical semiconductor element and the contact member so that the optical semiconductor element is indirectly connected to the contact member through the drive device.

5. The optical-electric conversion connector according to claim 1, wherein said waveguide supporting member is formed in a V-notch shape so that the optical waveguide member is accommodated in the waveguide supporting member from above.

6. A method of producing an optical-electric conversion connector to be connected to a mating connector, comprising the steps of:

positioning an optical semiconductor element for converting between an optical signal and an electrical signal relative to a supporting member according to a reference hole formed in the supporting member or a member connected to the supporting member;

mounting the optical semiconductor element on the supporting member;

connecting a contact member for contacting with a mating contact member of the mating connector to the optical semiconductor element with a conductive member;

sealing the optical semiconductor element with a transparent resin;

molding a first resin member using the transparent resin, said first resin member including a waveguide supporting member for supporting an optical waveguide member, a rising portion member, said rising portion including a vertical surface arranged to face a distal end surface of the optical waveguide member so that the optical signal passes through the rising portion, said rising portion further including a reflection surface opposite to the vertical surface for reflecting the optical signal inside the rising portion so that the optical signal is transmitted directly from the optical waveguide member to the optical semiconductor element so that the optical signal is transmitted between the optical waveguide member and the optical semiconductor element; and molding a second resin member using a resin different from the transparent resin integrally on an outer surface of the transparent resin.

7. The method of producing the optical-electric conversion connector according to claim 6, further comprising the steps of:

cutting the contact member from a carrier of a metal lead frame at a portion of the contact member extending from the transparent resin after the step of molding the transparent resin; and bending the contact member in a specific shape after the step of cutting the contact member, wherein said supporting member and said contact member are formed of one single portion of the metal lead frame having the carrier, said reference hole being formed in the carrier, said contact member being formed in a plurality of narrow band pieces.

8. The method of producing the optical-electric conversion connector according to claim 6, wherein said supporting member is formed of a resin or a ceramic, said contact member being printed on the supporting member.

9. The method of producing the optical-electric conversion connector according to claim 6, further comprising the steps of:

mounting a drive device for driving the optical semiconductor element on the supporting member or the member connected to the supporting member before the step of connecting the contact member so that the drive device is connected to the optical semiconductor element and the contact member in the step of connecting the contact member so that the optical semiconductor element is indirectly connected to the contact member through the drive device.

10. The method of producing the optical-electric conversion connector according to claim 6, wherein said waveguide supporting member is formed in a v-notch shape so that the optical waveguide member is accommodated in the waveguide supporting member from above.

* * * * *